US012580559B2

(12) United States Patent
  Isobe

(10) Patent No.: US 12,580,559 B2
(45) Date of Patent: Mar. 17, 2026

(54) SEMICONDUCTOR DEVICE, IPS HAVING TEMPERATURE DEPENDENCY CORRECTION FUNCTION, AND INVERTER DEVICE

(71) Applicant: FUJI ELECTRIC CO., LTD., Kawasaki (JP)

(72) Inventor: Daisuke Isobe, Matsumoto-city (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 420 days.

(21) Appl. No.: 18/193,194

(22) Filed: Mar. 30, 2023

(65) Prior Publication Data

US 2023/0336173 A1 Oct. 19, 2023

(30) Foreign Application Priority Data

Apr. 15, 2022 (JP) ................................. 2022-067370

(51) Int. Cl.
| | |
|---|---|
| *H02H 3/00* | (2006.01) |
| *H02H 1/00* | (2006.01) |
| *H02H 3/087* | (2006.01) |
| *H03K 5/24* | (2006.01) |
| *H03K 17/14* | (2006.01) |

(52) U.S. Cl.
  CPC ........... *H03K 17/14* (2013.01); *H02H 1/0007* (2013.01); *H02H 3/087* (2013.01); *H03K 5/24* (2013.01)

(58) Field of Classification Search
  IPC ....................................................... H03K 17/14
  See application file for complete search history.

(56) References Cited

U.S. PATENT DOCUMENTS

| | | | | |
|---|---|---|---|---|
| 4,716,871 | A * | 1/1988 | Sakamoto | ............. F02D 31/005 |
| | | | | 123/588 |
| 9,065,462 | B1* | 6/2015 | Kakamu | ............. H03M 1/1061 |
| 2008/0100978 | A1* | 5/2008 | Maebara | ........... H03K 17/0828 |
| | | | | 361/93.8 |
| 2013/0257517 | A1 | 10/2013 | Kawashima | |
| 2019/0326865 | A1* | 10/2019 | Okabe | ..................... H03F 3/211 |
| 2021/0296881 | A1 | 9/2021 | Minagawa | |
| 2022/0069815 | A1 | 3/2022 | Minagawa | |

FOREIGN PATENT DOCUMENTS

| | | |
|---|---|---|
| JP | 2006211834 A | 8/2006 |
| JP | 2009156835 A | 7/2009 |
| JP | 2011086742 A | 4/2011 |
| JP | 2012060618 A | 3/2012 |
| JP | 2021150820 A | 9/2021 |
| JP | 2022037262 A | 3/2022 |
| WO | 2013005520 A1 | 1/2013 |

OTHER PUBLICATIONS

Japanese Patent Office Action for corresponding JP Patent Application No. 2022-067370 issued on Nov. 11, 2025.

* cited by examiner

*Primary Examiner* — Stephen W Jackson
(74) *Attorney, Agent, or Firm* — RABIN & BERDO, P.C.

(57) ABSTRACT

A semiconductor device, including: a semiconductor element configured to generate an output current that varies with a change in a temperature of the semiconductor element; a temperature detection circuit that detects the temperature and outputs a temperature detection signal based on the detected temperature; and a correction circuit that causes the output current of the semiconductor element to change based on the temperature detection signal.

20 Claims, 22 Drawing Sheets

SEMICONDUCTOR DEVICE, IPS HAVING TEMPERATURE DEPENDENCY CORRECTION FUNCTION, AND INVERTER DEVICE

CROSS-REFERENCE TO RELATED APPLICATION

This application is based upon and claims the benefit of priority of the prior Japanese Patent Application No. 2022-067370, filed on Apr. 15, 2022, the entire contents of which are incorporated herein by reference.

BACKGROUND OF THE INVENTION

1. Field of the Invention

The embodiment discussed herein relates to a semiconductor device, an IPS having a temperature dependency correction function, and an inverter device.

2. Background of the Related Art

Recent years have seen progress in the development of semiconductor devices called intelligent power switches (IPSs). An IPS is manufactured by forming switch elements using power semiconductor elements, a switch element drive circuit, and a protection circuit therearound, etc. on one chip.

For example, these IPSs are widely used in vehicle electrical systems such as transmissions, engines, and brakes, and smaller, more sophisticated, and more reliable products are demanded.

FIG. 21 illustrates a configuration example of a conventional IPS. FIG. 21 illustrates a schematic circuit configuration around an output stage of a high side IPS. This IPS 100a includes an input terminal IN, an output terminal OUT, a power supply terminal VT, and a ground terminal GND.

The input terminal IN receives a pulsed control signal outputted from a microcomputer or the like. The output terminal OUT is connected to a load 200. The power supply terminal VT is connected to a power supply voltage VCC, and the ground terminal GND is connected to the ground (GND).

The IPS 100a includes an output element M0, a logic circuit 110, a gate driver 120, and an overcurrent detection circuit 130a. The output element M0 is a power semiconductor element that drives the load 200. In the example in FIG. 21, an N-channel metal-oxide-semiconductor field-effect transistor (MOSFET), which will be referred to as an NMOS transistor, is used as the output element M0.

The logic circuit 110 receives a control signal inputted through the input terminal IN and generates a logic signal for turning on or off the output element M0. Based on the logic signal outputted from the logic circuit 110, the gate driver 120 generates a drive signal for turning on or off the output element M0 and applies the drive signal to the gate of the output element M0.

When the output element M0 is in an on-state, if the overcurrent detection circuit 130a detects that a current abnormally larger than the rated current of the output element M0 has flowed through the output element M0, the overcurrent detection circuit 130a transmits an overcurrent detection signal s0 indicating occurrence of the overcurrent to the logic circuit 110.

When the output element M0 in the IPS 100a is in an on-state, an output voltage VOUT applied to the output terminal OUT varies depending on the current flowing through the output element M0. Thus, the overcurrent detection circuit 130a compares the power supply voltage VCC with the output voltage VOUT applied to the output terminal OUT, to detect whether the output element M0 is in an overcurrent state. If the logic circuit 110 detects the over-current detection signal s0, the logic circuit 110 turns off the output element M0.

FIG. 22 illustrates a configuration example of another conventional IPS. This IPS 100b has an overcurrent protection function, as is the case with the IPS 100a. Like components in FIGS. 21 and 22 will be denoted by like reference characters, and redundant description thereof will be omitted.

The IPS 100b includes an output element M0, a sense element Ms, a resistor Rs, a logic circuit 110, a gate driver 120, and an overcurrent detection circuit 130b. An NMOS transistor is used as the sense element Ms.

When the output element M0 of the IPS 100b is in an on-state, a current that is proportional to the current flowing through the output element M0 flows through the sense element Ms, and the current from the sense element Ms flows through the resistor Rs. Thus, a voltage drop occurs between one end of the resistor Rs connected to the source of the sense element Ms and the other end of the resistor Rs connected to an output terminal OUT. The voltage drop becomes larger as a larger current flows through the output element M0.

The overcurrent detection circuit 130b monitors this voltage drop (corresponding to the potential difference between the two ends of the resistor Rs based on the current flowing through the sense element Ms when the output element M0 is in an on-state) and detects whether the output element M0 is in an overcurrent state based on the voltage drop being monitored.

As a related technique, for example, there has been proposed a technique for determining whether a switching element is supplied with an overcurrent based on an output voltage obtained by adding a detection voltage obtained by converting a detection current of the switching element into a voltage and a temperature correction voltage that offsets the temperature dependency of the detection voltage (Japanese Laid-open Patent Publication No. 2006-211834). There has also been proposed a technique in which a correction table indicating a correspondence relationship between measured data and temperature data is generated. In this technique, if temperature data read from the correction table matches measured data, the read temperature data is output-ted (Japanese Laid-open Patent Publication No. 2011-086742).

In the case of the above IPSs 100a and 100b, for example, when the load 200 is short-circuited, a current excessively larger than that in a normal operation could flow, and the output element M0 and its peripheral circuit could malfunction. Thus, the IPSs 100a and 100b each has a function of detecting an overcurrent as described above and protecting the corresponding IPS 100a or 100b, as one failure tolerance design.

However, the overcurrent detection circuits 130a and 130b sometimes include semiconductor elements that have temperature dependency. That is, characteristics of these semiconductor elements change depending on the temperature. Thus, since characteristics of the semiconductor elements change with a change in temperature, these conventional techniques have a problem in that the operation accuracy of the device deteriorates.

SUMMARY OF THE INVENTION

In one aspect of the embodiment, there is provided a semiconductor device including: a semiconductor element configured to generate an output current that varies with a change in a temperature of the semiconductor element; a temperature detection circuit that detects the temperature and outputs a temperature detection signal based on the detected temperature; and a correction circuit that causes the output current of the semiconductor element to change based on the temperature detection signal.

The object and advantages of the invention will be realized and attained by means of the elements and combinations particularly pointed out in the claims.

It is to be understood that both the foregoing general description and the following detailed description are exemplary and explanatory and are not restrictive of the invention.

DETAILED DESCRIPTION OF THE INVENTION

Figure 1:
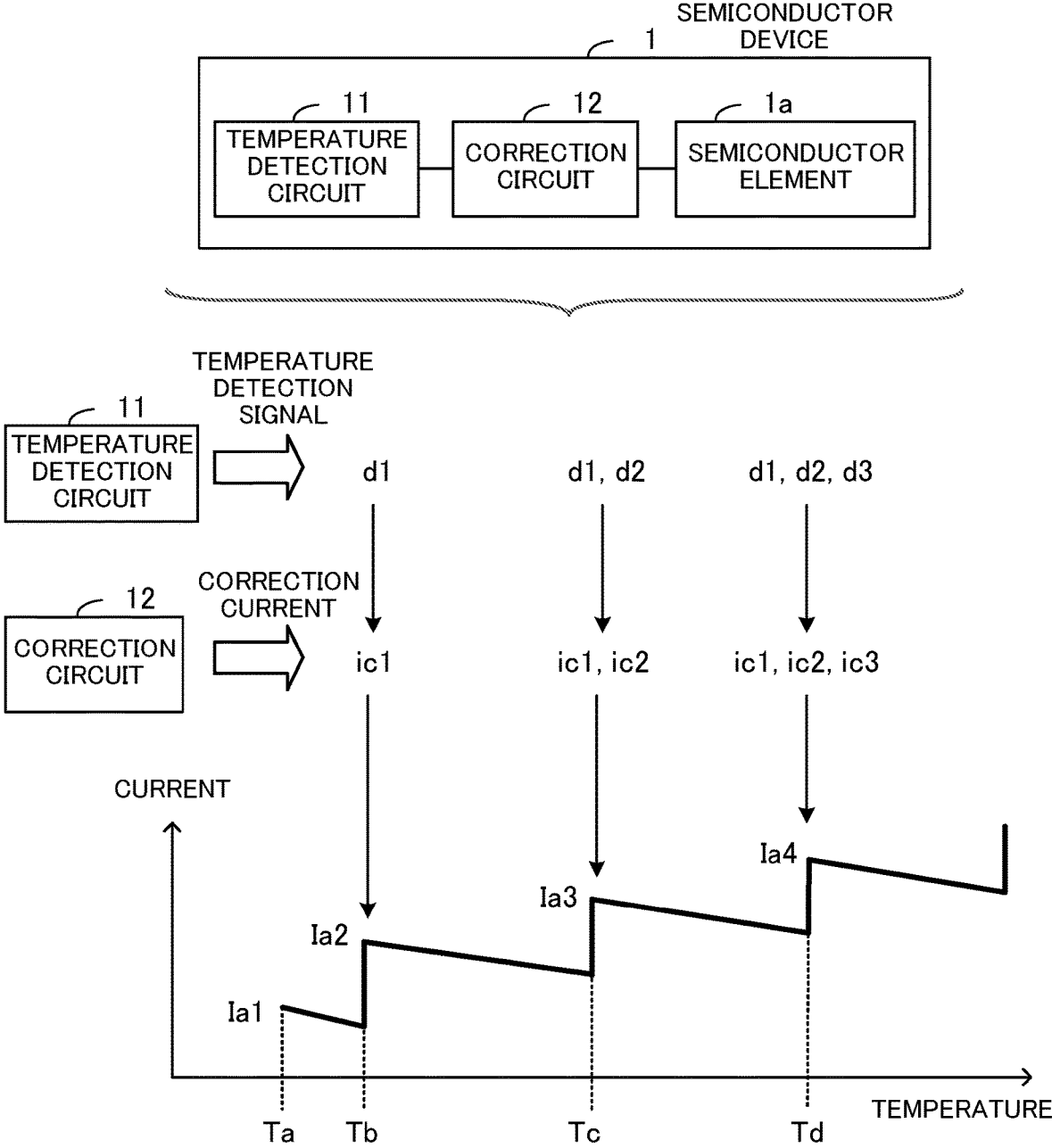
FIG. 1 illustrates an example of a semiconductor device.

Hereinafter, an embodiment will be described with reference to the accompanying drawings. In the present specification and drawings, elements having substantially the same function will be denoted by the same reference character, and redundant description thereof will be omitted as needed.

FIG. 1 illustrates an example of a semiconductor device. This semiconductor device 1 includes a semiconductor element 1a, a temperature detection circuit 11, and a correction circuit 12 and has a temperature compensation function. The semiconductor element 1a has temperature dependency and has characteristics in that the output current varies with a change in temperature. The temperature detection circuit 11 detects a temperature and outputs a temperature detection signal based on the detected temperature. The correction circuit 12 corrects the characteristics of the semiconductor element 1a based on the temperature detection signal.

[Temperature Ta] When the temperature of the semiconductor element 1a is a temperature Ta, a current Ia1 is outputted from the semiconductor element 1a. The semiconductor element 1a has temperature dependency. That is, the output current of the semiconductor element 1a decreases with a rise in temperature. Thus, as illustrated in FIG. 1, as the temperature rises, the output current gradually decreases from the current Ia1.

[Temperature Tb] The temperature of the semiconductor element 1a rises to a temperature Tb. In this case, the temperature detection circuit 11 detects the temperature Tb and outputs a temperature detection signal d1. Upon receiving the temperature detection signal d1, the correction circuit 12 outputs a correction current ic1. Next, the correction circuit 12 adds the correction current ic1 to the current flowing through the output end of the semiconductor element 1a so that the output current reaches a current Ia2. This current Ia2 also decreases with a rise in temperature.

[Temperature Tc] The temperature of the semiconductor element 1a rises to a temperature Tc. In this case, the temperature detection circuit 11 detects the temperature Tc and outputs a temperature detection signal d2. The output of the temperature detection signal d1 is maintained. Upon receiving the temperature detection signal d2, the correction circuit 12 outputs a correction current ic2, in addition to the correction current ic1. The correction circuit 12 adds the correction current ic2 to the current flowing through the output end of the semiconductor element 1a so that the output current reaches a current Ia3. This current Ia3 also decreases with a rise in temperature.

[Temperature Td] The temperature of the semiconductor element 1a rises to a temperature Td. In this case, the temperature detection circuit 11 detects the temperature Td and outputs a temperature detection signal d3. The output of the temperature detection signals d1 and d2 is maintained. Upon receiving the temperature detection signal d3, the correction circuit 12 outputs a correction current ic3, in addition to the correction currents ic1 and ic2. The correction circuit 12 adds the correction current ic3 to the current flowing through the output end of the semiconductor element 1a so that the output current reaches a current Ia4. This current Ia4 also decreases with a rise in temperature.

As described above, the semiconductor device 1 detects the temperature of a temperature detection target, generates a temperature detection signal based on the detected temperature, and corrects the characteristics of the semiconductor element 1a based on the temperature detection signal. In this way, the temperature compensation is achieved for the semiconductor element 1$a$. Thus, even when the temperature changes, it is possible to improve the operation accuracy of a device including the semiconductor element 1$a$ having temperature dependency.

<Temperature Detection Circuit>

Figure 2:
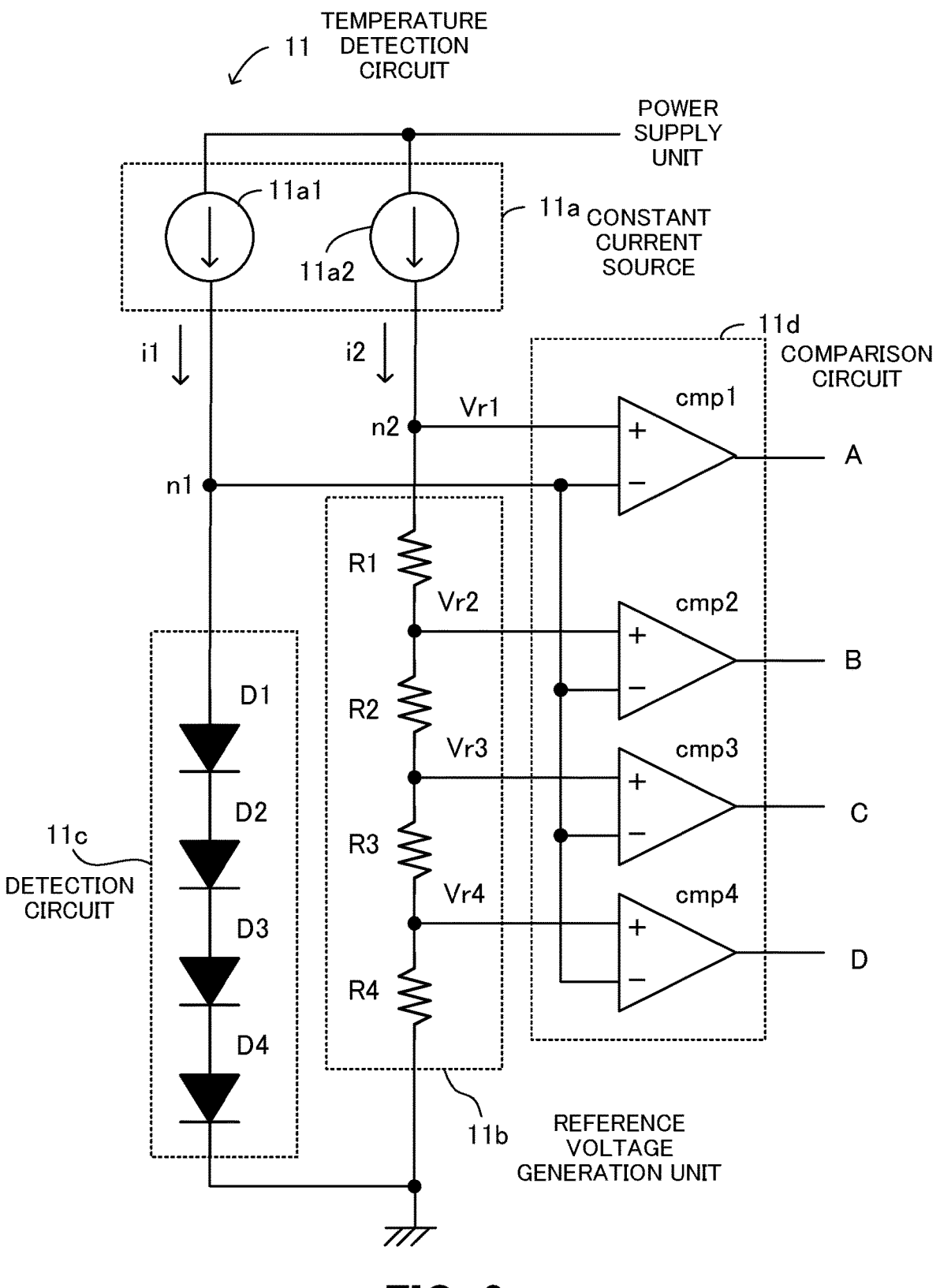
FIG. 2 illustrates a configuration example of a temperature detection circuit.

FIG. 2 illustrates a configuration example of the temperature detection circuit. The temperature detection circuit 11 includes a constant current source 11$a$ (a temperature detection constant current source), a reference voltage generation unit 11$b$, a detection circuit 11$c$, and a comparison circuit 11$d$. The constant current source 11$a$ includes a constant current element 11$a$1 (a first constant current element) and a constant current element 11$a$2 (a second constant current element). The reference voltage generation unit 11$b$ includes resistors R1 to R4, which correspond to first to fourth resistors, respectively.

The detection circuit 11$c$ includes temperature sensing diodes D1 to D4 whose temperature detection voltage that is based on a current from the constant current source 11$a$ drops with a rise in temperature. The comparison circuit 11$d$ includes comparators cmp1 to cmp4, which correspond to first to fourth comparators, respectively.

The above elements are connected as follows. The input end of the constant current element 11$a$1 is connected to the input end of the constant current element 11$a$2 and a power supply unit. The output end of the constant current element 11$a$1 is connected to the anode of the temperature sensing diode D1, the inverting input terminal (−) of the comparator cmp1, the inverting input terminal (−) of the comparator cmp2, the inverting input terminal (−) of the comparator cmp3, and the inverting input terminal (−) of the comparator cmp4.

The cathode of the temperature sensing diode D1 is connected to the anode of the temperature sensing diode D2. The cathode of the temperature sensing diode D2 is connected to the anode of the temperature sensing diode D3. The cathode of the temperature sensing diode D3 is connected to the anode of the temperature sensing diode D4. The number of these series-connected temperature sensing diodes D1 to D4 is not limited to 4. The temperature detection circuit 11 may include any number of series-connected temperature sensing diodes.

The output end of the constant current element 11$a$2 is connected to the non-inverting input terminal (+) of the comparator cmp1 and one end of the resistor R1. The other end of the resistor R1 is connected to one end of the resistor R2 and the non-inverting input terminal (+) of the comparator cmp2.

The other end of the resistor R2 is connected to one end of the resistor R3 and the non-inverting input terminal (+) of the comparator cmp3. The other end of the resistor R3 is connected to one end of the resistor R4 and the non-inverting input terminal (+) of the comparator cmp4. The other end of the resistor R4 is connected to the cathode of the temperature sensing diode D4 and the ground GND.

In this configuration, because a current i1 that flows from the constant current element 11$a$1 to the temperature sensing diodes D1 to D4 is a forward current with respect to the temperature sensing diodes D1 to D4, a voltage (a temperature detection voltage) at a node n1 is a sum of forward voltages at the temperature sensing diodes D1 to D4 (hereinafter referred to as forward voltages Vf). For example, assuming that each of the forward voltages Vf of the temperature sensing diodes D1 to D4 is 0.8 V, the temperature detection voltage at the node n1 is 3.2 (=0.8×4) V.

In addition, the temperature sensing diodes D1 to D4 have temperature characteristics. Specifically, each forward voltage Vf varies with the temperature. For example, if the temperature rises by 1° C., each forward voltage Vf drops by approximately 2 mV.

Thus, for example, if the temperature rises from 25° C. to 50° C., the forward voltage Vf of one temperature sensing diode drops by 0.05 (=0.002×25) V.

Thus, assuming that each forward voltage Vf is 0.8 V at a temperature of 25° C., if the temperature rises to 50° C., the forward voltages Vf of the temperature sensing diodes D1 to D4 drop by 0.2 (=0.05×4) V in total, and the temperature detection voltage at the node n1 becomes 3.0 (3.2−0.2) V.

As described above, although the temperature detection voltage at the node n1 is 3.2 V at a temperature of 25° C., this temperature detection voltage changes to 3.0 V when the temperature rises to 50° C. That is, the temperature detection voltage varies with a change in temperature. Specifically, the temperature detection voltage drops with a rise in temperature.

In addition, a current i2 is outputted from the constant current element 11$a$2 (the currents i1 and i2 may have the same value or different values). Assuming that a voltage applied to a node n2 is a reference voltage Vr1, this reference voltage Vr1 is inputted to the non-inverting input terminal (+) of the comparator cmp1.

In addition, a reference voltage Vr2 inputted to the non-inverting input terminal (+) of the comparator cmp2 is expressed by Vr2=(R2+R3+R4)·Vr1/(R1+R2+R3+R4) based on resistive voltage division.

In addition, a reference voltage Vr3 inputted to the non-inverting input terminal (+) of the comparator cmp3 is expressed by Vr3=(R3+R4)·Vr1/(R1+R2+R3+R4) based on resistive voltage division.

In addition, a reference voltage Vr4 inputted to the non-inverting input terminal (+) of the comparator cmp4 is expressed by Vr4=R4·Vr1/(R1+R2+R3+R4) based on resistive voltage division. These reference voltages Vr1 to Vr4 have a magnitude relationship expressed by Vr4<Vr3<Vr2<Vr1.

The present embodiment assumes that a detection target temperature T falls within one of the following four temperature ranges defined by Tj1 to Tj4 (Tj1<Tj2<Tj3<Tj4). The temperature detection voltage at the node n1 at the temperature Tj1 is a temperature detection voltage Vt1, and the temperature detection voltage at the node n1 at the temperature Tj2 is a temperature detection voltage Vt2.

In addition, the temperature detection voltage at the node n1 at the temperature Tj3 is a temperature detection voltage Vt3, and the temperature detection voltage at the node n1 at the temperature Tj4 is a temperature detection voltage Vt4. These temperature detection voltages Vt1 to Vt4 have a magnitude relationship expressed by Vt4<Vt3<Vt2<Vt1.

In the case of the temperature detection circuit 11, when the temperature T of the semiconductor element 1$a$ used as the temperature detection target is expressed by T<Tj1, the comparators cmp1 to cmp4 output L-level temperature detection signals A to D, respectively.

In addition, when the temperature T is expressed by Tj1≤T<Tj2, the temperature detection voltage Vt1 becomes lower than the reference voltage Vr1 and higher than the reference voltages Vr2 to Vr4. As a result, the comparator cmp1 outputs an H-level temperature detection signal A, and the comparators cmp2 to cmp4 output L-level temperature detection signals B to D, respectively.

In addition, when the temperature rises and is expressed by Tj2≤T<Tj3, the temperature detection voltage Vt2 becomes lower than the reference voltages Vr1 and Vr2 and higher than the reference voltages Vr3 and Vr4. As a result, the comparators cmp1 and cmp2 output H-level temperature detection signals A and B, respectively, and the comparators cmp3 and cmp4 output L-level temperature detection signals C and D, respectively.

In addition, when the temperature further rises and is expressed by Tj3≤T<Tj4, the temperature detection voltage Vt3 becomes lower than the reference voltages Vr1 to Vr3 and higher than the reference voltage Vr4. As a result, the comparators cmp1 to cmp3 output H-level temperature detection signals A to C, respectively, and the comparator cmp4 outputs an L-level temperature detection signal D.

In addition, when the temperature further rises and is expressed by Tj4≤T, the temperature detection voltage Vt4 becomes lower than the reference voltages Vr1 to Vr4. As a result, the comparators cmp1 to cmp4 output H-level temperature detection signals A to D, respectively.

As described above, the comparators cmp1 to cmp4 of the temperature detection circuit 11 output H-level (predetermined level) temperature detection signals in stages with a rise in temperature. Assuming that the outputs of the comparators cmp1 to cmp4 are digital logic outputs (H-level=1 and L-level=0) and are expressed by (A, B, C, D), when the temperature T of the semiconductor element 1a as the temperature detection target is expressed by T<Tj1, (A, B, C, D)=(0, 0, 0, 0).

In addition, when the temperature T is expressed by Tj1≤T<Tj2, (A, B, C, D)=(1, 0, 0, 0). When the temperature T is expressed by Tj2≤T<Tj3, (A, B, C, D)=(1, 1, 0, 0). When the temperature T is expressed by Tj3≤T<Tj4, (A, B, C, D)=(1, 1, 1, 0). When the temperature T is expressed by Tj4≤T, (A, B, C, D)=(1, 1, 1, 1).

In this way, the temperature detection circuit 11 outputs n temperature detection signals corresponding to n temperature ranges (n is a natural number). In the above example in which n=4, since there are four temperature ranges, the temperature detection circuit 11 outputs the four temperature detection signals A to D.

Based on a current from the constant current source 11a, the reference voltage generation unit 11b generates n reference voltages whose voltage values are set in descending order from the first reference voltage to a kth reference voltage (1≤k≤n) of the n reference voltages.

In the above example in which n=4, the reference voltage generation unit 11b generates the first to fourth reference voltages Vr1 to Vr4 (Vr4<Vr3<Vr2<Vr1).

In addition, the comparison circuit 11d compares the kth reference voltage (1≤k≤n) of the n reference voltages with the temperature detection voltage. If the kth reference voltage is higher than the temperature detection voltage, the comparison circuit 11d outputs the kth and lower temperature detection signals.

In the above example in which n=4, when the comparison circuit 11d compares the first reference voltage Vr1 of the four reference voltages with the temperature detection voltage, if the first reference voltage is higher than the temperature detection voltage, the comparison circuit 11d outputs the first temperature detection signal A (H-level temperature detection signal A). When the comparison circuit 11d compares the second reference voltage Vr2 of the four reference voltages with the temperature detection voltage, if the second reference voltage Vr2 is higher than the temperature detection voltage, the comparison circuit 11d outputs the second temperature detection signal B and the lower first temperature detection signal A (H-level temperature detection signals A and B).

In addition, when the comparison circuit 11d compares the third reference voltage Vr3 of the four reference voltages with the temperature detection voltage, if the third reference voltage Vr3 is higher than the temperature detection voltage, the comparison circuit 11d outputs the third temperature detection signal C and the lower first and second temperature detection signals A and B (H-level temperature detection signals A to C). In addition, when the comparison circuit 11d compares the fourth reference voltage Vr4 of the four reference voltages with the temperature detection voltage, if the fourth reference voltage Vr4 is higher than the temperature detection voltage, the comparison circuit 11d outputs the fourth temperature detection signal D and the lower first to third temperature detection signals A to C (H-level temperature detection signals A to D).

<Correction Circuit>

Figure 3:
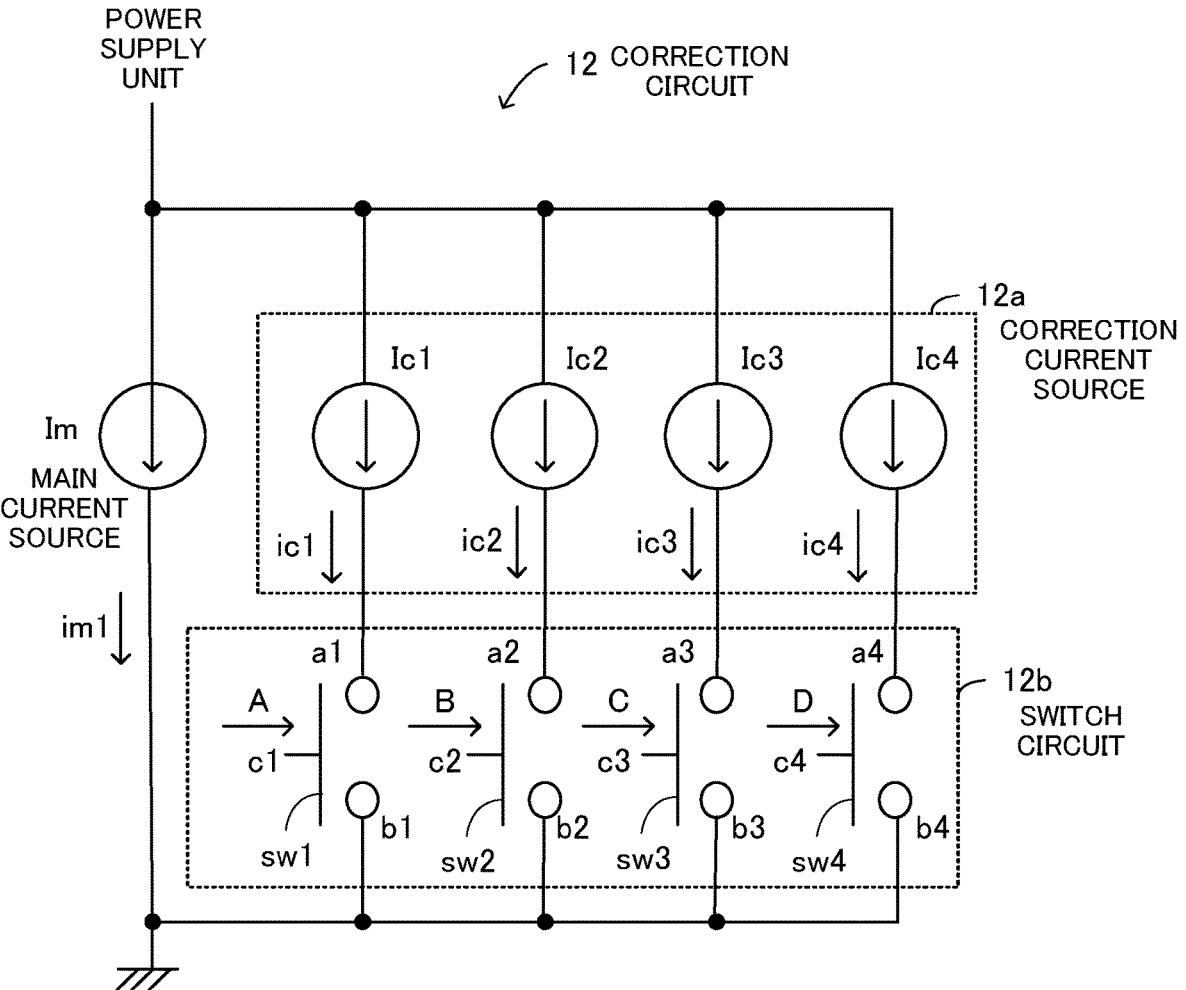
FIG. 3 illustrates a configuration example of a correction circuit.

FIG. 3 illustrates a configuration example of the correction circuit. The correction circuit 12 includes a correction current source 12a and a switch circuit 12b. A main current source Im corresponds to the semiconductor element 1a as the current correction target.

The correction current source 12a includes correction current elements Ic1 to Ic4, and the switch circuit 12b includes switches sw1 to sw4. The main current source Im outputs a main current im1, and the correction current elements Ic1 to Ic4 output correction currents ic1 to ic4, respectively.

The above elements are connected as follows. The input end of the main current source Im is connected to the power supply unit and the input ends of the correction current elements Ic1 to Ic4. The output end of the correction current element Ic1 is connected to a terminal a1 of a switch sw1, and the output end of the correction current element Ic2 is connected to a terminal a2 of the switch sw2. The output end of the correction current element Ic3 is connected to a terminal a3 of the switch sw3, and the output end of the correction current element Ic4 is connected to a terminal a4 of the switch sw4. The terminals a1 to a4 each correspond to a first terminal.

The output end of the main current source Im is connected to a terminal b1 of the switch sw1, a terminal b2 of the switch sw2, a terminal b3 of the switch sw3, a terminal b4 of the switch sw4, and the ground GND. The terminals b1 to b4 each correspond to a second terminal.

A terminal c1 of the switch sw1 is connected to the output terminal of the comparator cmp1 and receives the temperature detection signal A. A terminal c2 of the switch sw2 is connected to the output terminal of the comparator cmp2 and receives the temperature detection signal B. A terminal c3 of the switch sw3 is connected to the output terminal of the comparator cmp3 and receives the temperature detection signal C. A terminal c4 of the switch sw4 is connected to the output terminal of the comparator cmp4 and receives the temperature detection signal D. The terminals c1 to c4 each correspond to a control terminal.

The main current source Im is the semiconductor element 1a having temperature dependency. For example, when the main current source Im is configured by a MOS transistor or the like, the main current source Im has prominent temperature dependency. The main current im1 outputted from the main current source Im having this temperature dependency could decrease with a rise in temperature. Thus, the correction circuit 12 performs correction control for maintaining the original current by compensating for the current that decreases with a rise in temperature.

Regarding the switching of the switches sw1 to sw4, when the H-level temperature detection signal A is inputted from the comparator cmp1, the switch sw1 is switched on. When the L-level temperature detection signal A is inputted from the comparator cmp1, the switch sw1 is switched off. When the H-level temperature detection signal B is inputted from the comparator cmp2, the switch sw2 is switched on. When the L-level temperature detection signal B is inputted from the comparator cmp2, the switch sw2 is switched off.

Similarly, when the H-level temperature detection signal C is inputted from the comparator cmp3, the switch sw3 is switched on. When the L-level temperature detection signal C is inputted from the comparator cmp3, the switch sw3 is switched off. When the H-level temperature detection signal D is inputted from the comparator cmp4, the switch sw4 is switched on. When the L-level temperature detection signal D is inputted from the comparator cmp4, the switch sw4 is switched off.

Regarding the current correction performed by the correction circuit 12, when the temperature T of the main current source Im as the temperature detection target is expressed by $T<Tj1$, all the outputs of the comparators cmp1 to cmp4 are at the L level, and the switches sw1 to sw4 remain off. As a result, the main current im1 is outputted from the main current source Im.

When the temperature T is expressed by $Tj1 \leq T<Tj2$, the comparator cmp1 outputs the H-level temperature detection signal A, and the comparators cmp2 to cmp4 output their respective L-level temperature detection signals B to D. Thus, the switch sw1 is switched on, and the switches sw2 to sw4 remain off. Thus, the correction current ic1 outputted from the correction current element Ic1 is added to the main current im1 at the output end of the main current source Im.

When the temperature T is expressed by $Tj2 \leq T<Tj3$, the comparators cmp1 and cmp2 output their respective H-level temperature detection signals A and B, and the comparators cmp3 and cmp4 output their respective L-level temperature detection signals C and D. Thus, the switches sw1 and sw2 are switched on, and the switches sw3 and sw4 remain off. As a result, the correction current ic2 outputted from the correction current element Ic2 is added to the sum of the main current im1 and the correction current ic1 at the output end of the main current source Im.

When the temperature T is expressed by $Tj3 \leq T<Tj4$, the comparators cmp1 to cmp3 output their respective H-level temperature detection signals A to C, and the comparator cmp4 outputs the L-level temperature detection signal D. Thus, the switches sw1 to sw3 are switched on, and the switch sw4 remains off. As a result, the correction current ic3 outputted from the correction current element Ic3 is added to the sum of the main current im1, the correction current ic1, and the correction current ic2 at the output end of the main current source Im.

When the temperature T is expressed by $Tj4 \leq T$, the comparators cmp1 to cmp4 output their respective H-level temperature detection signals A to D. Thus, all the switches sw1 to sw4 are switched on. As a result, the correction current ic4 outputted from the correction current element Ic4 is added to the sum of the main current im1, the correction current ic1, the correction current ic2, and the correction current ic3 at the output end of the main current source Im.

As described above, the correction circuit 12 includes the correction current source 12a including the n correction current elements and includes a switch circuit 12b including n switches for switching the output of the correction current source 12a.

In the above example in which n=4, the correction circuit 12 includes the correction current elements Ic1 to Ic4 and the switches sw1 to sw4. In addition, the kth and lower temperature detection signals indicating the predetermined level are outputted, the kth and lower switches are switched on, and the kth and lower correction current elements output their respective correction currents.

In the above example in which n=4, when the first H-level temperature detection signal A is outputted, the first switch sw1 is switched on, and the correction current ic1 is outputted from the first correction current element Ic1.

In addition, when the second and lower (first and second) H-level temperature detection signals A and B are outputted, the second and lower (first and second) switches sw1 and sw2 are switched on, and the correction currents ic1 and ic2 are outputted from the second and lower (first and second) correction current elements Ic1 and Ic2.

In addition, when the third and lower (first to third) H-level temperature detection signals A to C are outputted, the third and lower (first to third) switches sw1 to sw3 are switched on, and the correction currents ic1 to ic3 are outputted from the third and lower (first to third) correction current elements Ic1 to Ic3.

In addition, when the fourth and lower (first to fourth) H-level temperature detection signals A to D are outputted, the fourth and lower (first to fourth) switches sw1 to sw4 are switched on, and the correction currents ic1 to ic4 are outputted from the fourth and lower (first to fourth) correction current elements Ic1 to Ic4.

In this way, even when the current outputted from the main current source Im having temperature dependency decreases with a rise in temperature, the correction current source 12a in the correction circuit 12 is able to correct the decreased current at the output end of the main current source Im.

<IPS Including Overcurrent Detection Circuit>

For example, the above-described semiconductor device 1 is applicable to an IPS including an overcurrent detection circuit. Thus, an IPS including an overcurrent detection circuit to which the temperature compensation function of the semiconductor device 1 is applied will hereinafter be described. However, for a step-by-step description, first, a configuration and an operation of an IPS including an overcurrent detection circuit to which the temperature compensation function of the semiconductor device 1 has not yet been applied will be described with reference to FIGS. 4 to 9.

Figure 4:
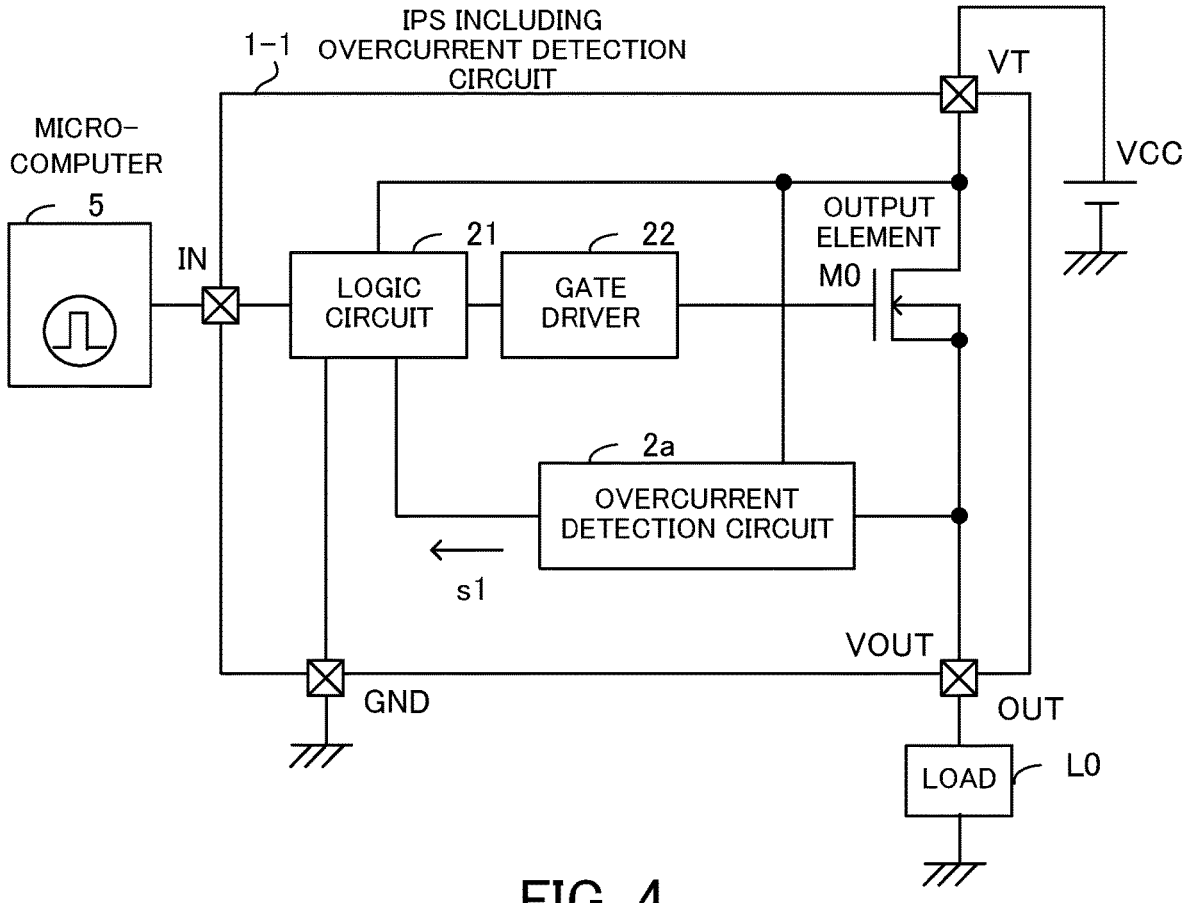
FIG. 4 illustrates a configuration example of an IPS including an overcurrent detection circuit.

FIG. 4 illustrates a configuration example of an IPS including an overcurrent detection circuit. This IPS 1-1 including an overcurrent detection circuit is included in, for example, an IPS (a high side IPS) and includes an input terminal IN, an output terminal OUT, a power supply terminal VT, and a ground terminal GND.

The input terminal IN is connected to a microcomputer 5 and receives a pulsed control signal from the microcomputer 5. The output terminal OUT is connected to a load L0. The load L0 is, for example, an inductive load such as a solenoid valve widely used in automobiles or a resistive load such as a heater. The power supply terminal VT is connected to a power supply voltage VCC such as a battery, and the ground terminal GND is connected to the ground GND.

This IPS 1-1 includes an output element M0, a logic circuit 21, a gate driver 22, and an overcurrent detection circuit 2a. The output element M0 is a power semiconductor element that drives the load L0. In the example in FIG. 4, an NMOS transistor is used. Instead of an NMOS transistor, an insulated gate bipolar transistor (IGBT) may be used alternatively.

The logic circuit 21 receives the control signal transmitted from the microcomputer 5 through the input terminal IN and generates a logic signal for turning on or off the output element M0. For example, upon receiving an H-level control signal transmitted through the input terminal IN, the logic circuit 21 outputs a logic signal for turning on the output element M0.

Based on the logic signal outputted from the logic circuit 21, the gate driver 22 generates a voltage for turning on the output element M0 and applies the voltage to the gate of the output element M0, to turn on the output element M0.

In addition, upon receiving an L-level control signal transmitted from the microcomputer 5 through the input terminal IN, the logic circuit 21 outputs a logic signal for turning off the output element M0. Based on the logic signal outputted from the logic circuit 21, the gate driver 22 generates a signal having a level for turning off the output element M0 and applies the signal to the gate of the output element M0, to turn off the output element M0.

If the potential difference between two points of a current path exceeds a detection threshold, the overcurrent detection circuit 2a detects an overcurrent in the current path. In this IPS 1-1, the overcurrent detection circuit 2a is connected between the power supply terminal VT and the output terminal OUT. When the output element M0 is in an on-state, if the overcurrent detection circuit 2a detects that a current abnormally larger than the rated current of the output element M0 has flowed through the output element M0, the overcurrent detection circuit 2a transmits an overcurrent detection signal s1 to the logic circuit 21. In addition, the overcurrent detection circuit 2a detects an overcurrent by using, as an overcurrent detection threshold, the potential difference between the power supply voltage VCC and the output voltage that is determined based on the on-resistance of the output element M0 and the current flowing through the output element M0 and that is applied to the load L0 from the output terminal OUT.

Upon receiving the overcurrent detection signal s1 from the overcurrent detection circuit 2a, the logic circuit 21 outputs a logic signal for turning off the output element M0. Based on the logic signal outputted from the logic circuit 21, the gate driver 22 turns off the output element M0.

Figure 5:
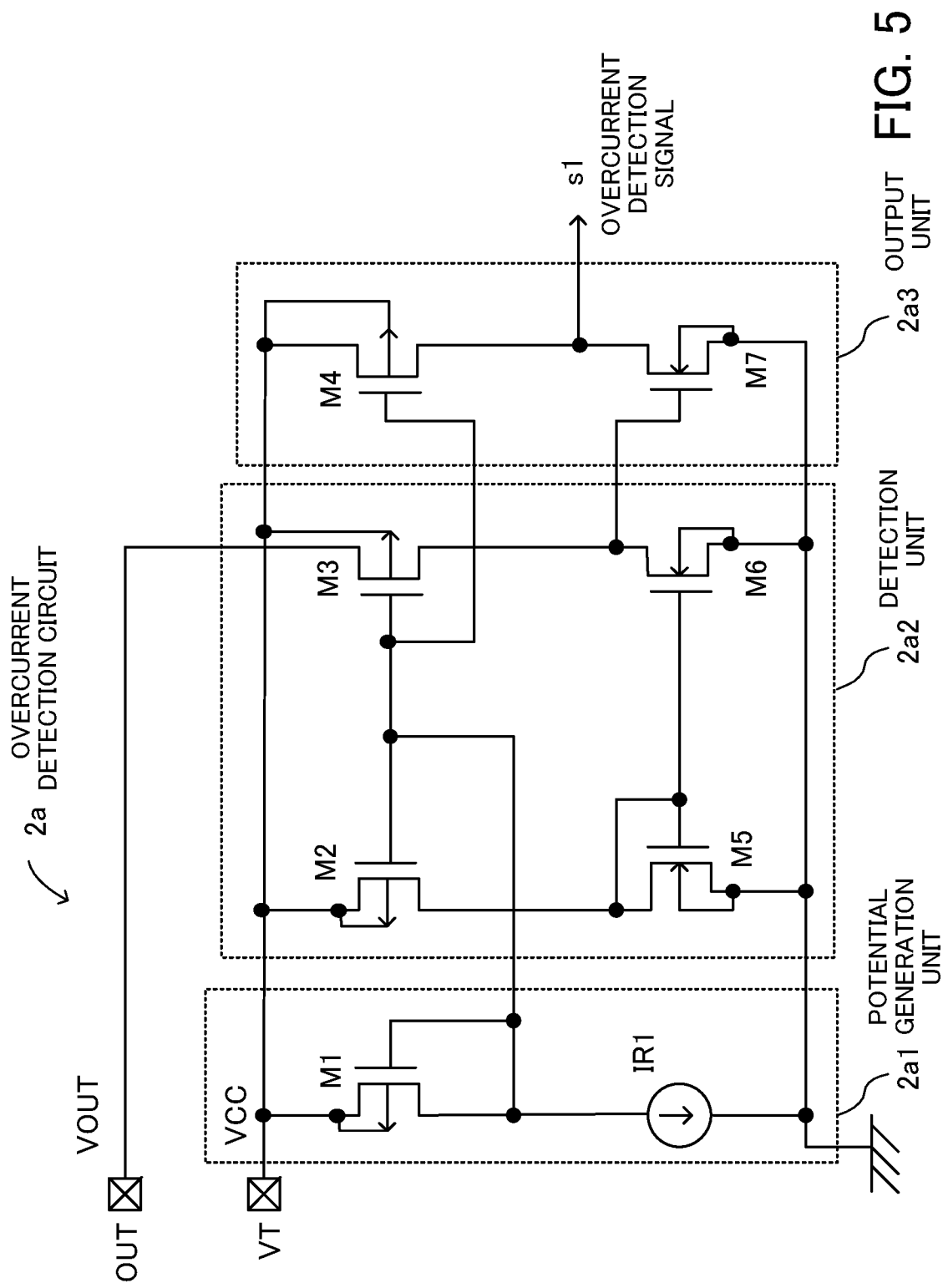
FIG. 5 illustrates a configuration example of the overcurrent detection circuit.

FIG. 5 illustrates a configuration example of the overcurrent detection circuit. The overcurrent detection circuit 2a includes PMOS transistors M1 to M4, which are P-channel MOSFETs, NMOS transistors M5 to M7, and a constant current source IR1. The PMOS transistors M1 to M3 correspond to first to third PMOS transistors, respectively. The NMOS transistors M5 and M6 correspond to first and second NMOS transistors, respectively.

The above elements are connected as follows. The source of the PMOS transistor M1 is connected to the back gate (body) of the PMOS transistor M1, the power supply terminal VT, the back gate and the source (a first high potential end) of the PMOS transistor M2, the back gate of the PMOS transistor M3, and the source and the back gate of the PMOS transistor M4. The source (a second high potential end) of the PMOS transistor M3 is connected to the output terminal OUT.

The drain of the PMOS transistor M1 is connected to the input end of the constant current source IR1, the gate of the PMOS transistor M1, the gate of the PMOS transistor M2, the gate of the PMOS transistor M3, and the gate of the PMOS transistor M4.

The drain of the PMOS transistor M2 is connected to the drain and the gate of the NMOS transistor M5 and the gate of the NMOS transistor M6. The drain of the PMOS transistor M3 is connected to the drain of the NMOS transistor M6 and the gate of the NMOS transistor M7.

The drain of the PMOS transistor M4 is connected to the drain of the NMOS transistor M7. The output end of the constant current source IR1 is connected to the source and the back gate of the NMOS transistor M5, the source and the back gate of the NMOS transistor M6, the source and the back gate of the NMOS transistor M7, and the ground GND.

The overcurrent detection signal s1 indicating an overcurrent detection result is outputted from a connection node of the drain of the PMOS transistor M4 and the drain of the NMOS transistor M7.

The overcurrent detection circuit 2a includes: a potential generation unit 2a1 formed by the PMOS transistor M1 and the constant current source IR1; a detection unit 2a2 formed by PMOS transistors M2 and M3 constituting a differential element pair (a pair of elements) and NMOS transistors M5 and M6 constituting a current mirror; and an output unit 2a3 formed by the PMOS transistor M4 and the NMOS transistor M7.

The PMOS transistors M2 and M3 constituting a differential element pair have the same size. If the PMOS transistors M2 and M3 have the same gate-source voltage VGS, the same current flows through the PMOS transistors M2 and M3.

Thus, by varying the size of each of the PMOS transistors M2 and M3, the gate-source voltages VGS that are needed to flow the same current through the PMOS transistor M2 and M3 are made different from each other. The overcurrent detection circuit 2a uses this difference between the gate-source voltages VGS as an overcurrent detection threshold.

In addition, the overcurrent detection circuit 2a detects the overcurrent occurrence state by comparing the potential difference between the power supply terminal VT and the output terminal OUT (the potential difference that is proportional to an increase in the current flowing through the output element M0) with the detection threshold, which is the difference between the gate-source voltage VGS of the PMOS transistor M2 and the gate-source voltage VGS of the PMOS transistor M3.

Figure 6:
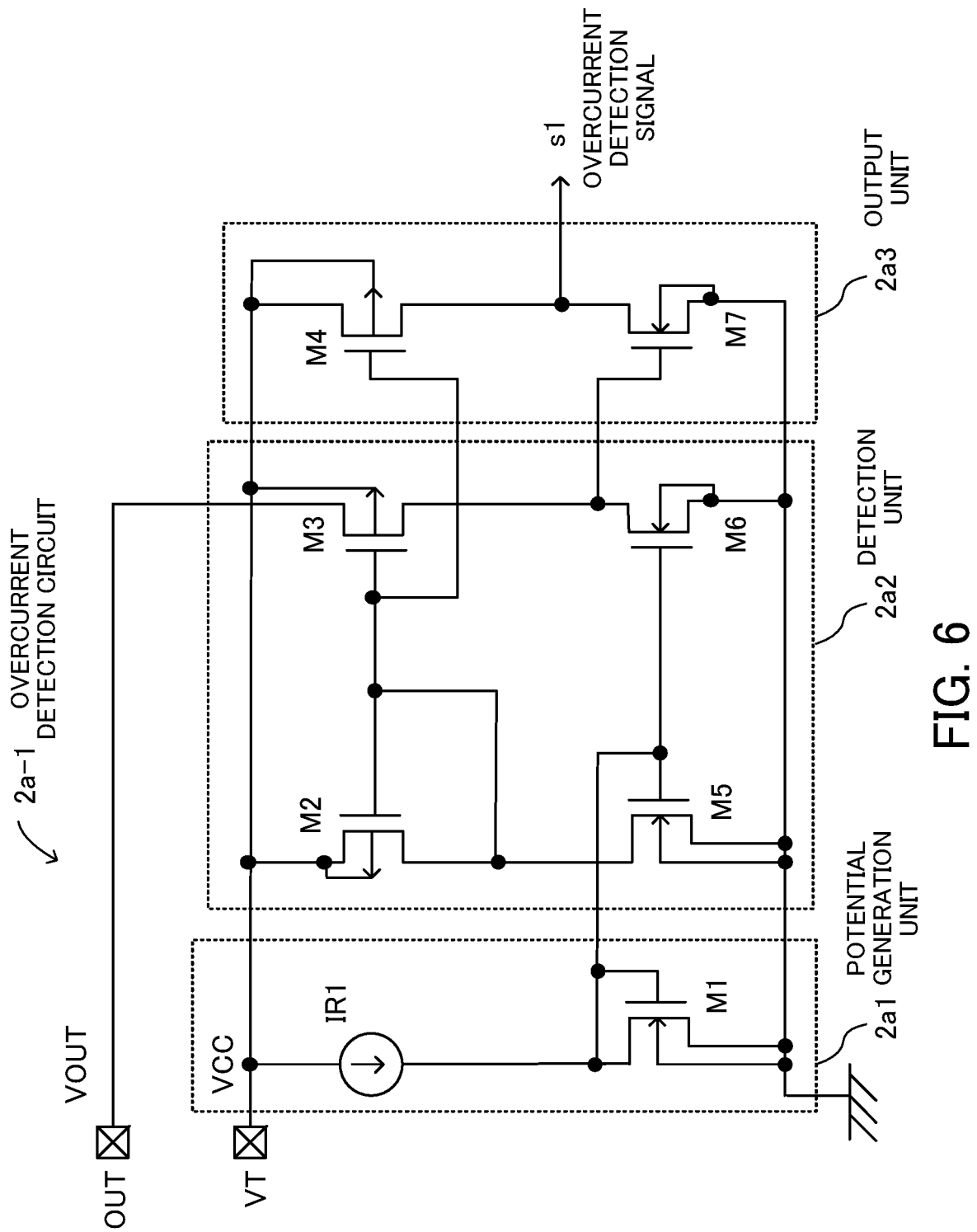
FIG. 6 illustrates a variation of the overcurrent detection circuit.

FIG. 6 illustrates a variation of the overcurrent detection circuit. This overcurrent detection circuit 2a-1 illustrates a circuit configuration of another version of the overcurrent detection circuit 2a in FIG. 5. In the overcurrent detection circuit 2a illustrated in FIG. 5, the constant current source is disposed near the GND. However, in the overcurrent detection circuit 2a-1 illustrated in FIG. 6, the constant current source is disposed near the power supply. In the overcurrent detection circuit 2a-1 illustrated in FIG. 6, first and second PMOS transistors correspond to the PMOS transistors M2 and M3, respectively, and first to third NMOS transistors correspond to the NMOS transistors M1, M5, and M6, respectively.

<Overcurrent Detection Threshold>

Figure 7:
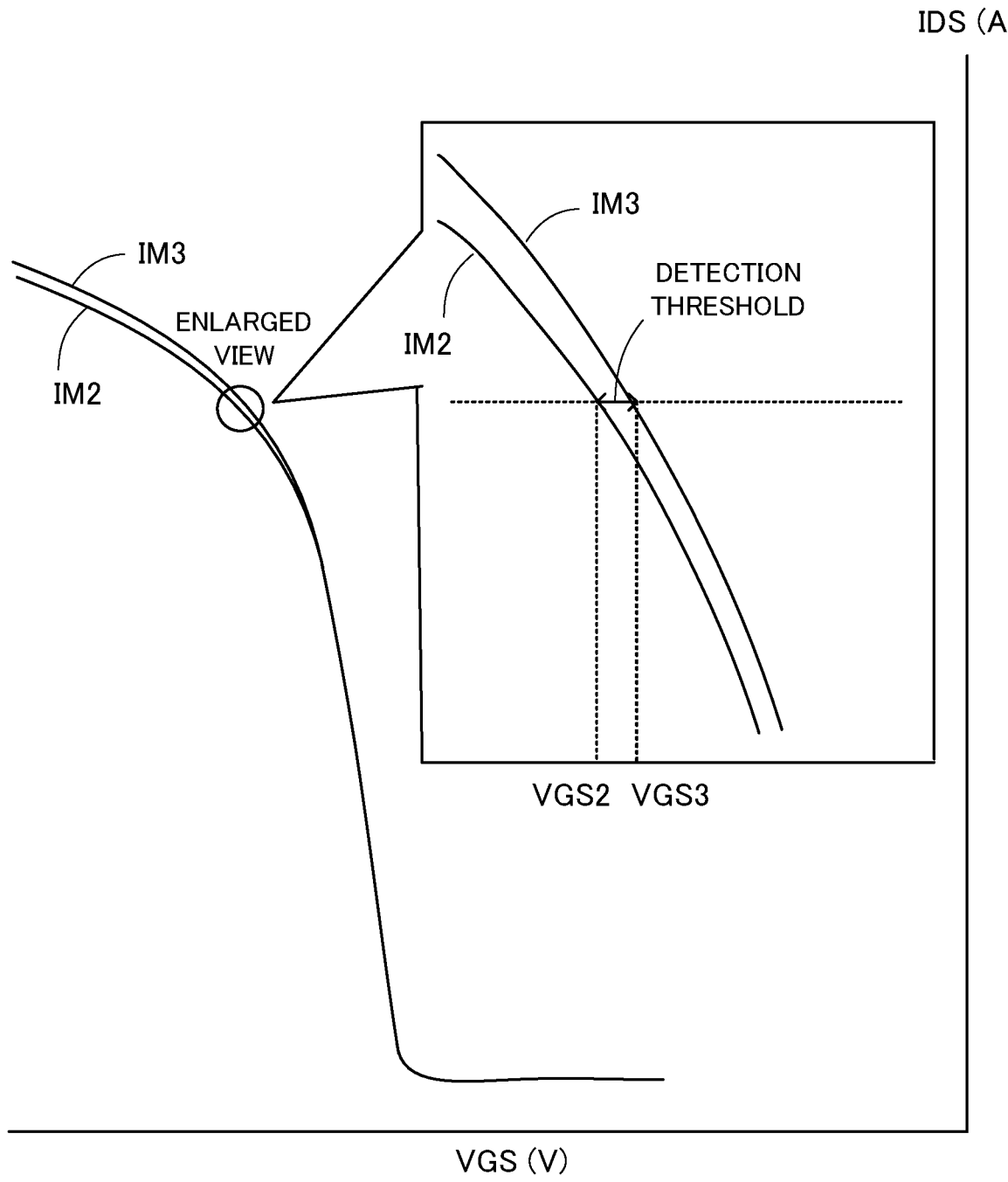
FIG. 7 illustrates an overcurrent detection threshold.

FIG. 7 illustrates the overcurrent detection threshold. The vertical axis represents the drain current IDS (A) and the horizontal axis represents the gate-source voltage VGS (V), which are all in their respective negative value ranges. The drain current of the PMOS transistor M2 will be referred to as a drain current IM2, and the drain current of the PMOS transistor M3 will be referred to as a drain current IM3.

In addition, the gate-source voltage of the PMOS transistor M2 will be referred to as a gate-source voltage VGS2, and the gate-source voltage of the PMOS transistor M3 will be referred to as a gate-source voltage VGS3.

In the example in FIG. 7, the size of each of the PMOS transistors M2 and M3 has been adjusted to satisfy VGS2<VGS3 (|VGS2|>|VGS3| if the absolute values are used) in the case where the drain currents IM2 and IM3 of the PMOS transistors M2 and M3 represent the same value. In this case, the potential difference between the gate-source voltage VGS2 and the gate-source voltage VGS3 (the potential difference between the source voltages of the PMOS transistors M2 and M3) is used as the detection threshold for the overcurrent detection performed by the overcurrent detection circuit 2a.

<Operation of Overcurrent Detection Circuit>

Figure 8:
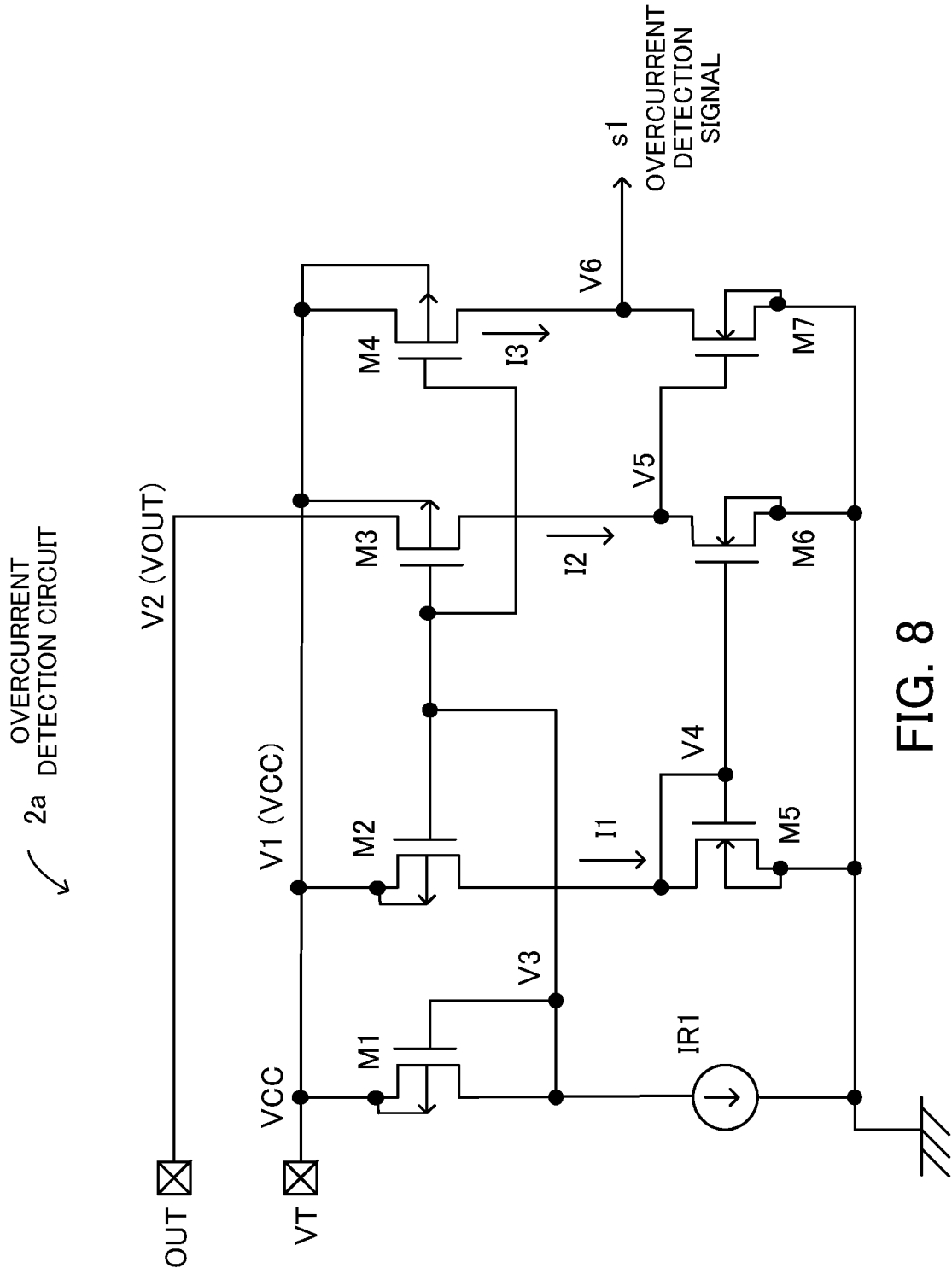
FIG. 8 illustrates an operation of the overcurrent detection circuit.

FIG. 8 illustrates an operation of the overcurrent detection circuit. Voltages V1 to V6 represent voltages at various nodes in the overcurrent detection circuit 2a in FIG. 8 (hereinafter the power supply voltage VCC will be referred to as the voltage V1, and the output voltage VOUT will be referred to as the voltage V2, as needed). In addition, the drain current of the PMOS transistor M2 will be referred to as a current I1, the drain current of the PMOS transistor M3 will be referred to as a current I2, and the drain current of the PMOS transistor M4 will be referred to as a current I3. In addition, the following description assumes that the size of the PMOS transistor M3 is larger than the size of the PMOS transistor M2.

Figure 9:
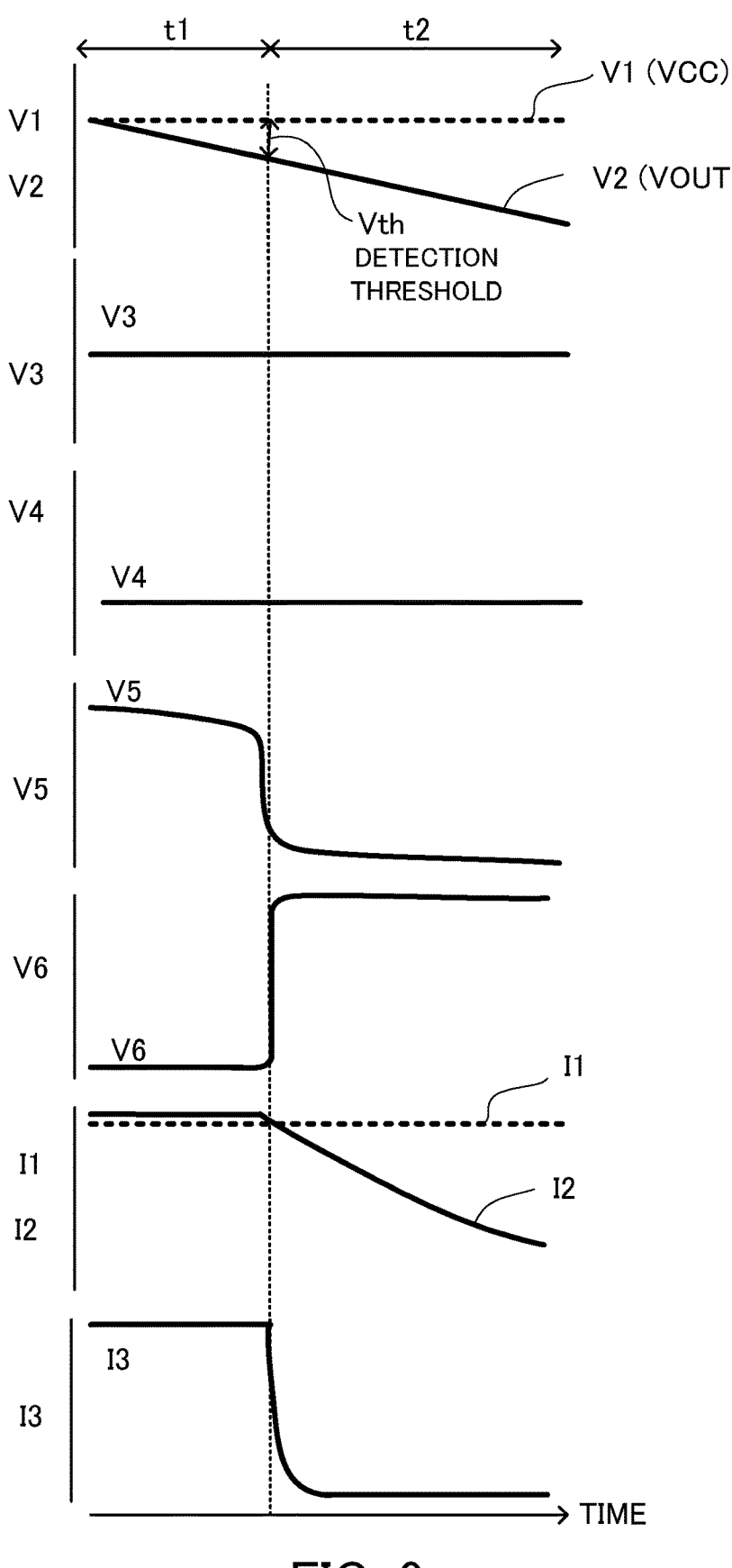
FIG. 9 is a time chart illustrating the operation of the overcurrent detection circuit.

FIG. 9 is a time chart illustrating the operation of the overcurrent detection circuit.

(Non-Overcurrent Detection Period t1 (Normal Operation Period))

[States of Voltages V1 and V2] The voltage V1 does not vary because the voltage V1 is the power supply voltage VCC applied from the power supply terminal VT. In contrast, when the output element M0 connected between the power supply terminal VT and the output terminal OUT is turned on, a current gradually flows through the output element M0, and the voltage V2 gradually drops as the current flowing through the output element M0 increases. The potential difference between the voltages V1 and V2 is a detection threshold Vth. In this period t1 (in which no overcurrent has occurred), the potential difference between the voltages V1 and V2 is less than the detection threshold Vth.

[State of Voltage V3] Because of the current of the constant current source IR1, the gate potential of the PMOS transistor M1 is lower than the source potential of the PMOS transistor M1, and the PMOS transistor M1 is turned on. The voltage V3 represents a constant voltage value determined by the on-resistance of the PMOS transistor M1.

[State of Voltage V4] Because the voltage V3 is applied to the gate of the PMOS transistor M2, the gate potential of the PMOS transistor M2 is lower than the source potential of the PMOS transistor M2, and the PMOS transistor M2 is turned on. As a result, because of the current flowing through the PMOS transistor M2, a voltage is applied to the gate of the NMOS transistor M5. Thus, the gate potential of the NMOS transistor M5 is higher than the source potential of the NMOS transistor M5, and the NMOS transistor M5 is turned on.

Thus, because the current I1 flows from the drain of the PMOS transistor M2 to the drain of the NMOS transistor M5, the voltage V4 applied to the gate of the NMOS transistor M5 is fixed to a constant voltage value that allows the flow of the current I1.

[State of Voltage V5] The voltage V2 is applied to the source of the PMOS transistor M3, and the voltage V3 is applied to the gate of the PMOS transistor M3. The voltage V2 is higher than the voltage V3. Thus, because the gate potential of the PMOS transistor M3 is lower than the source potential of the PMOS transistor M3, the PMOS transistor M3 is turned on.

In addition, the voltage V4 is applied to the gate of the NMOS transistor M6. Thus, because the gate potential of the NMOS transistor M6 is higher than the source potential of the NMOS transistor M6, the NMOS transistor M6 is turned on.

Thus, when the potential difference between the voltages V1 and V2 is less than the detection threshold Vth, the current I2 flows from the drain of the PMOS transistor M3 to the drain of the NMOS transistor M6, and the voltage V5 is applied to the drain of the NMOS transistor M6. The voltage V2 gradually drops as described above, and the voltage V5 gradually drops instead of remaining at a certain level.

[State of Voltage V6] Because the current I3 flows from the PMOS transistor M4 to the drain of the NMOS transistor M7, the voltage V6 is applied to the drain of the NMOS transistor M7.

In addition, the voltage V5 is applied to the gate of the NMOS transistor M7. Because the gate potential of the NMOS transistor M7 is higher than the source potential of the NMOS transistor M7, the NMOS transistor M7 is turned on.

Thus, the current I3 flows from the PMOS transistor M4 to the NMOS transistor M7. In addition, while the voltage V6 is applied to the drain of the NMOS transistor M7, the NMOS transistor M7 is on. In this state, because the current that the NMOS transistor M7 is able to flow is larger than the current from the PMOS transistor M4, the current I3 flows to the ground GND, and the voltage V6 reaches approximately the GND level.

In this state, because the voltage V3 is applied to the gate of the PMOS transistor M4, the gate potential of the PMOS transistor M4 is lower than the source potential, and the PMOS transistor M4 is turned on. Thus, because the current I3 flows from the drain of the PMOS transistor M4 to the drain of the NMOS transistor M7, the above description continues to apply.

[States of Currents I1 and I2] The currents I1 and I2 represent constant values. Because of the relationship between the gate-source voltage VGS2 of the PMOS transistor M2 and the gate-source voltage VGS3 of the PMOS transistor M3, when the potential difference between the voltages V1 and V2 is less than the detection threshold Vth, the current I2 that flows through the drain of the PMOS transistor M3 is somewhat larger than the current I1 that flows through the drain of the PMOS transistor M2.

[State of Current I3] Because the NMOS transistor M7 is on, the constant current I3 flows. In the non-overcurrent detection period (normal operation period), because the voltage V6 is approximately at the GND level, an L-level signal is outputted as the overcurrent detection signal s1, and this L-level overcurrent detection signal s1 is transmitted to the logic circuit 21.

(Overcurrent Detection Period t2)

[States of Voltages V1 and V2] The voltage V1 does not vary because the voltage V1 is the power supply voltage VCC applied from the power supply terminal VT. In addition, the output element M0 connected between the power supply terminal VT and the output terminal OUT remains on, and a current flows through the output element M0. The voltage V2 continues to drop after the period t1 as the current flowing through the output element M0 increases. In this period t2 (in which an overcurrent is considered to have occurred), the potential difference between the voltages V1 and V2 reaches the detection threshold Vth or more.

[State of Voltage V3] Because the state of the voltage V3 is the same as that in the period t1, the voltage V3 represents the constant voltage value determined by the on-resistance of the PMOS transistor M1.

[State of Voltage V4] Because the state of the voltage V4 is the same as that in the period t1, the voltage V4 is fixed at the constant gate voltage value at which the NMOS transistor M5 is able to flow the current I1.

[State of Voltage V5] While the potential difference between the voltages V1 and V2 is equal to or more than the detection threshold Vth, the voltage V2 further drops, and the potential difference between the power supply terminal VT and the output terminal OUT becomes larger than the potential difference between the gate-source voltages VGS2 and VGS3 of the PMOS transistors M2 and M3 that is determined as the detection threshold Vth.

In this case, because the voltage V4 having the same level as that in the period t1 is applied to the gate of the NMOS transistor M6, there is no change in the current drive capability of the NMOS transistor M6. That is, the NMOS transistor M6 is able to flow the same current.

In contrast, because the gate-source voltage VGS3 of the PMOS transistor M3 drops due to the drop of the voltage V2, the current drive capability of the PMOS transistor M3 decreases compared with that in the period t1 (the current I2 flowing through the PMOS transistor M3 decreases with the decrease of the current drive capability). Thus, when the current I2 falls below the current that the NMOS transistor M6 is able to flow, the voltage V5 applied to the drain of the PMOS transistor M3 drops.

[State of Voltage V6] When the voltage V5 drops, the NMOS transistor M7 is turned off. As a result, the voltage V6 rises due to the current I3.

[States of Currents I1 and I2] The current I1 remains constant as in the period t1. The current I2 decreases as the voltage V2 drops.

[State of Current I3] Since the NMOS transistor M7 is turned off, the current I3 decreases. Since the voltage V6 rises, an H-level signal is outputted as the overcurrent detection signal s1 indicating detection of an overcurrent. This H-level overcurrent detection signal s1 is transmitted to the logic circuit 21.

<IPS Including Overcurrent Protection Circuit Having Temperature Compensation Function>

Figure 10:
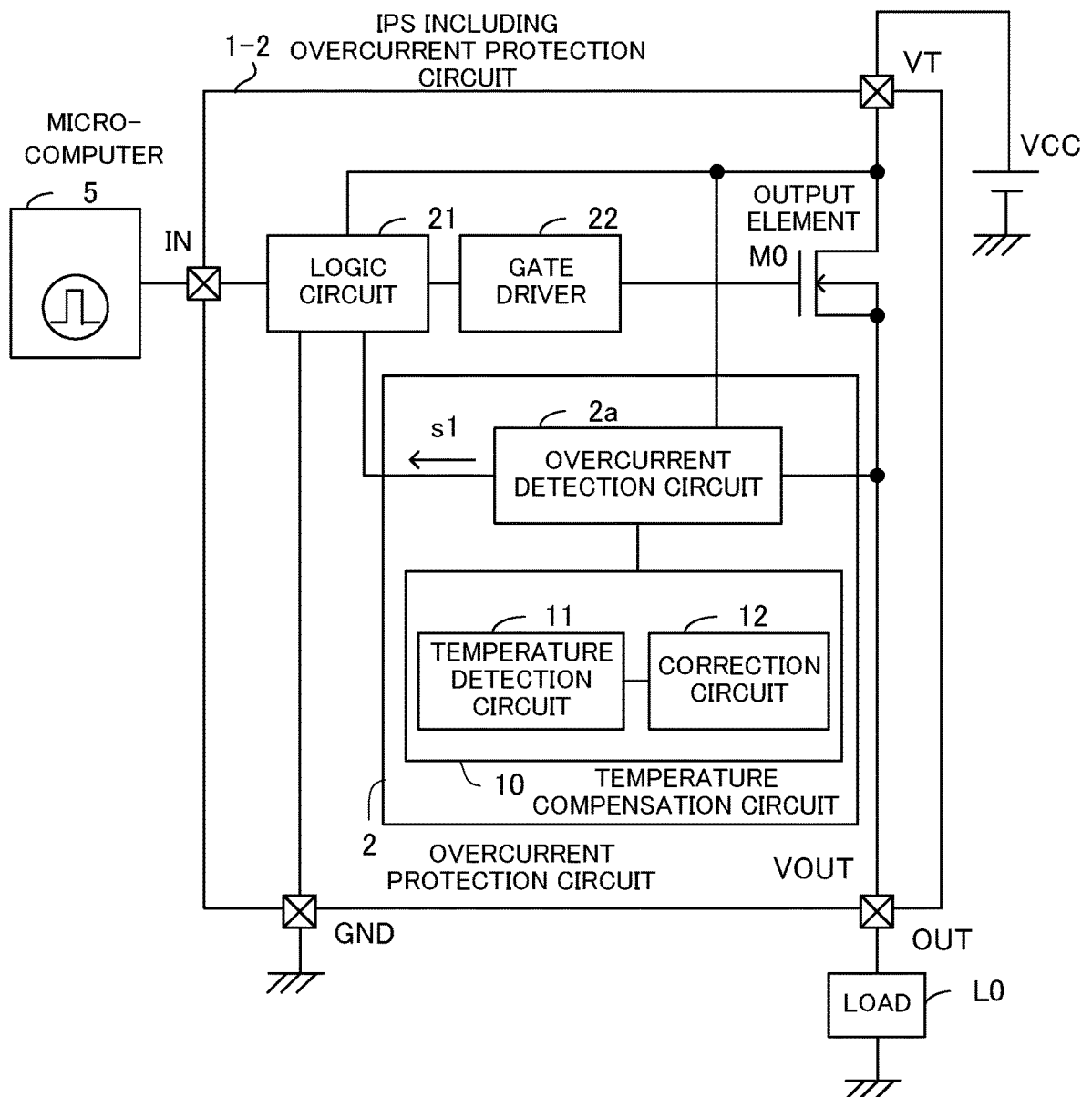
FIG. 10 illustrates a configuration example of an IPS including an overcurrent protection circuit having a temperature compensation function.

FIG. 10 illustrates a configuration example of an IPS including an overcurrent protection circuit having a temperature compensation function. This overcurrent-protection-circuit-equipped IPS 1-2 according to the present embodiment includes an overcurrent protection circuit 2, unlike the overcurrent-detection-circuit-equipped IPS 1-1 illustrated in FIG. 4. Other elements are the same as those in FIG. 4. The overcurrent protection circuit 2 includes the overcurrent detection circuit 2a and a temperature compensation circuit 10. The temperature compensation circuit 10 includes the temperature detection circuit 11 and the correction circuit 12 illustrated in FIGS. 2 and 3.

Figure 11:
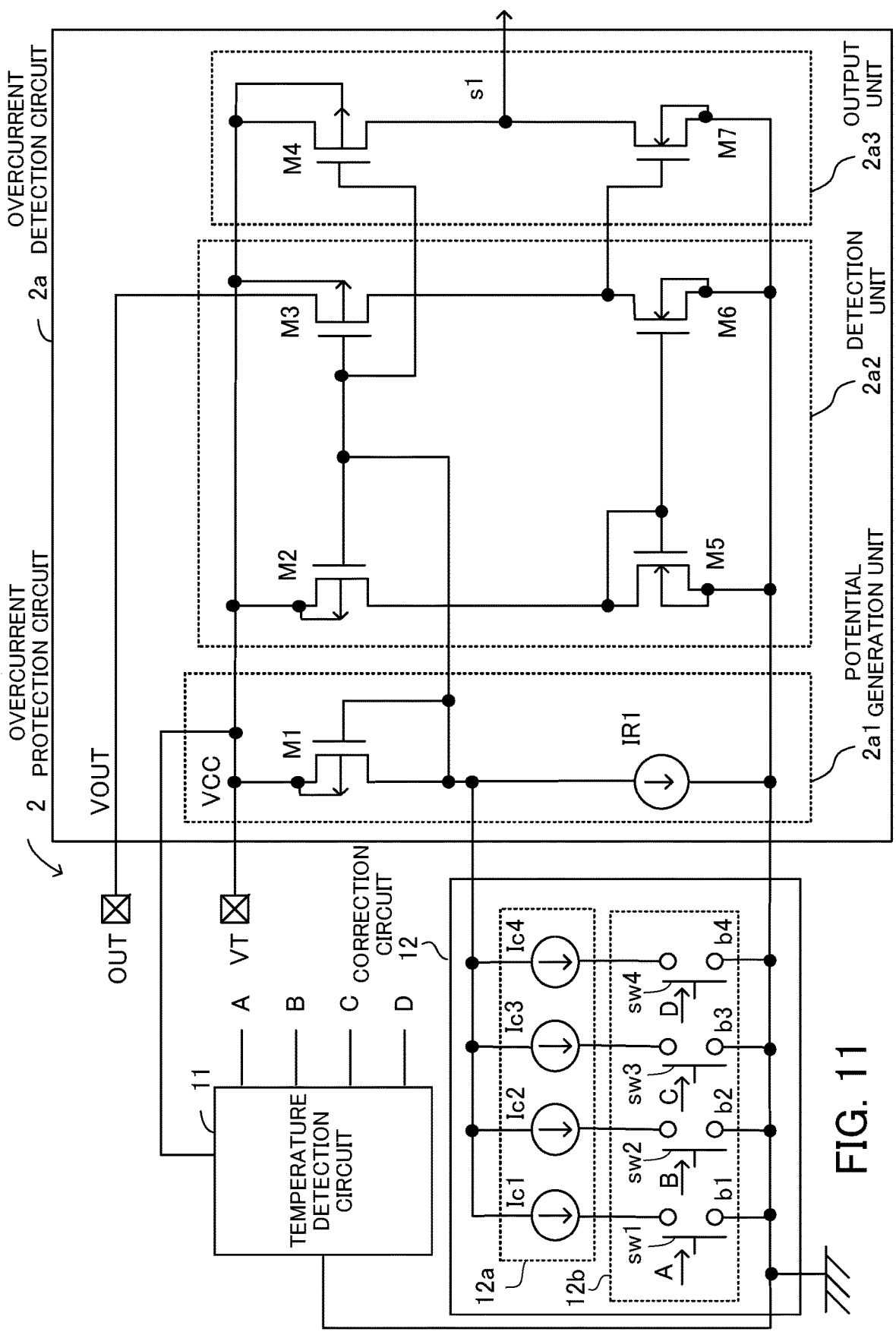
FIG. 11 illustrates a configuration example of the overcurrent protection circuit.
Figure 12:
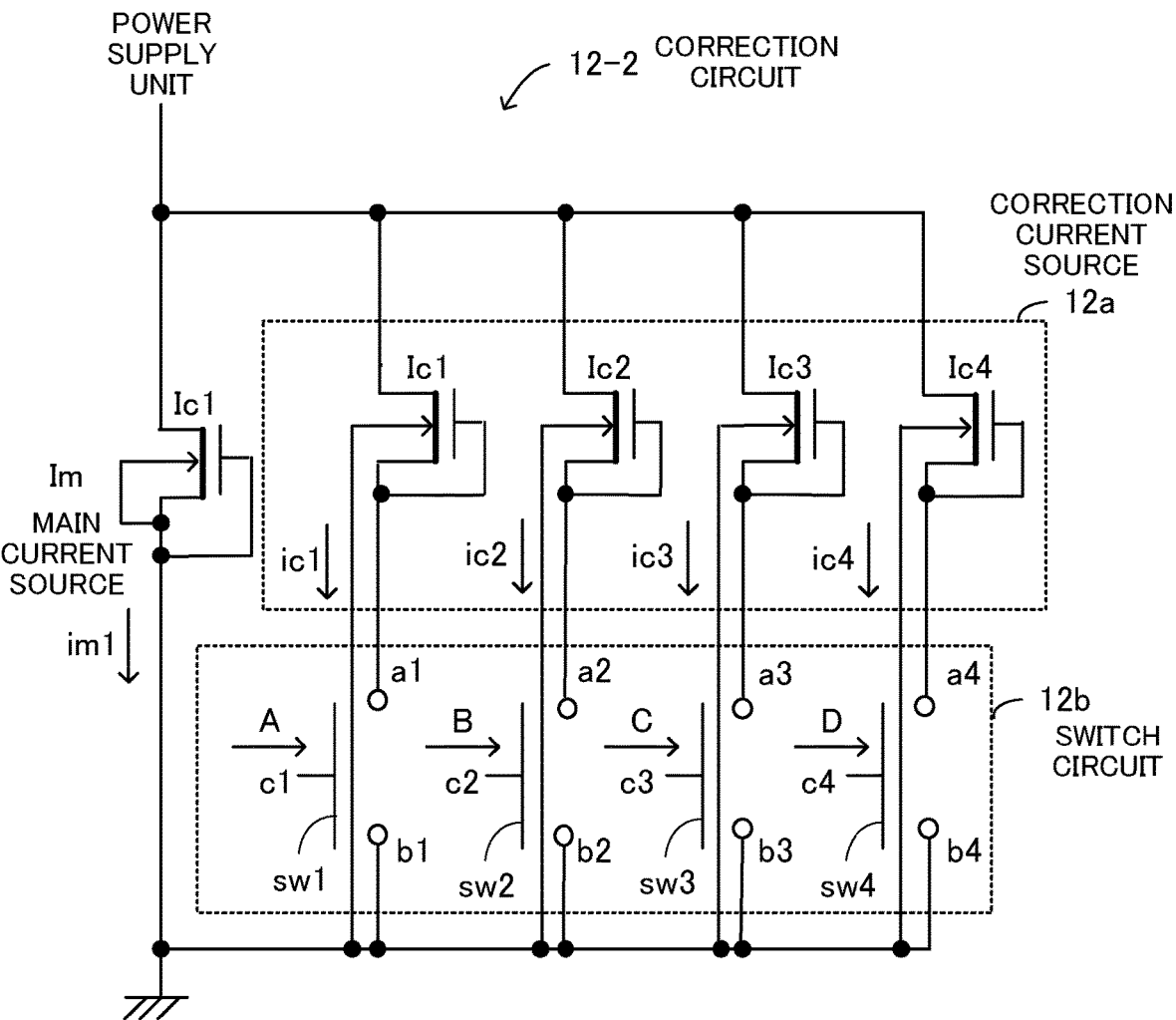
FIG. 12 illustrates a configuration example of a correction circuit.

FIG. 11 illustrates a configuration example of the overcurrent protection circuit. The overcurrent protection circuit 2 is obtained by adding the temperature detection circuit 11 and the correction circuit 12 to the overcurrent detection circuit 2a illustrated in FIG. 5. The constant current source IR1 in the overcurrent detection circuit 2a corresponds to the main current source Im illustrated in FIG. 3. The constant current source IR1 may be configured by using a depletion-type MOS transistor whose drain is used as its input end and whose gate, source, and back gate are used as its output end. In this configuration, the constant current source IR1 has prominent temperature dependency. Thus, the main current source Im illustrated in FIG. 3 corresponds to the constant current source IR1 in the overcurrent detection circuit 2a. FIG. 12 illustrates a correction circuit 12-2 in which the main current source Im and the correction current elements Ic1 to Ic4 illustrated in FIG. 3 are configured by depletion-type MOS transistors.

The correction circuit 12 and the overcurrent detection circuit 2a are connected as follows. The input end of the constant current source IR1 is connected to the input ends of the correction current elements Ic1 to Ic4, the drain and the gate of the PMOS transistor M1, the gate of the PMOS transistor M2, the gate of the PMOS transistor M3, and the gate of the PMOS transistor M4.

The output end of the constant current source IR1 is connected to the terminal b1 of the switch sw1, the terminal b2 of the switch sw2, the terminal b3 of the switch sw3, the terminal b4 of the switch sw4, the source and the back gate of the NMOS transistor M5, the source and the back gate of the NMOS transistor M6, the source and the back gate of the NMOS transistor M7, the ground terminal of the temperature detection circuit 11, and the ground GND. For example, the switches sw1 to sw4 may be configured by nMOS elements.

Figure 13:
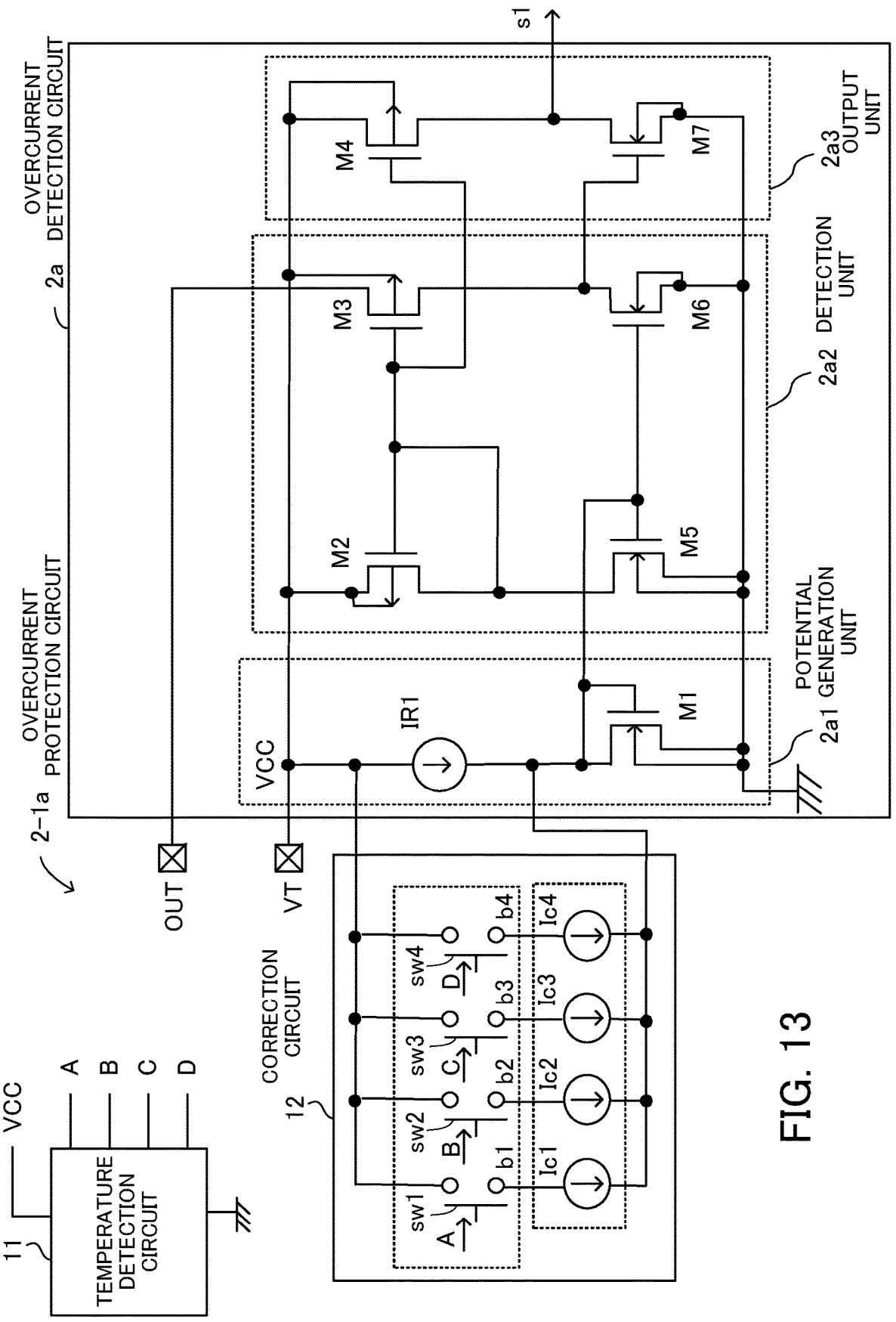
FIG. 13 illustrates a variation of the overcurrent protection circuit.

FIG. 13 illustrates a variation of the overcurrent protection circuit. This overcurrent protection circuit 2-1a has a circuit configuration of another version of the overcurrent protection circuit 2 illustrated in FIG. 11. The overcurrent protection circuit 2 illustrated in FIG. 11 includes the constant current source near the GND. However, the overcurrent protection circuit 2-1a illustrated in FIG. 13 includes the constant current source near the power supply. In addition, in the case of the overcurrent protection circuit 2 illustrated in FIG. 11, use of nMOS transistors for the switches sw1 to sw4 is assumed. However, in the case of the overcurrent protection circuit 2-1a illustrated in FIG. 13, use of pMOS transistors for the switches sw1 to sw4 is assumed. That is, when the individual signal from the temperature detection circuit 11 drops from the H level to the L level with a rise in temperature, the main current im1 increases and the threshold increases.

<Waveforms when Temperature Compensation is Performed>

Figure 14:
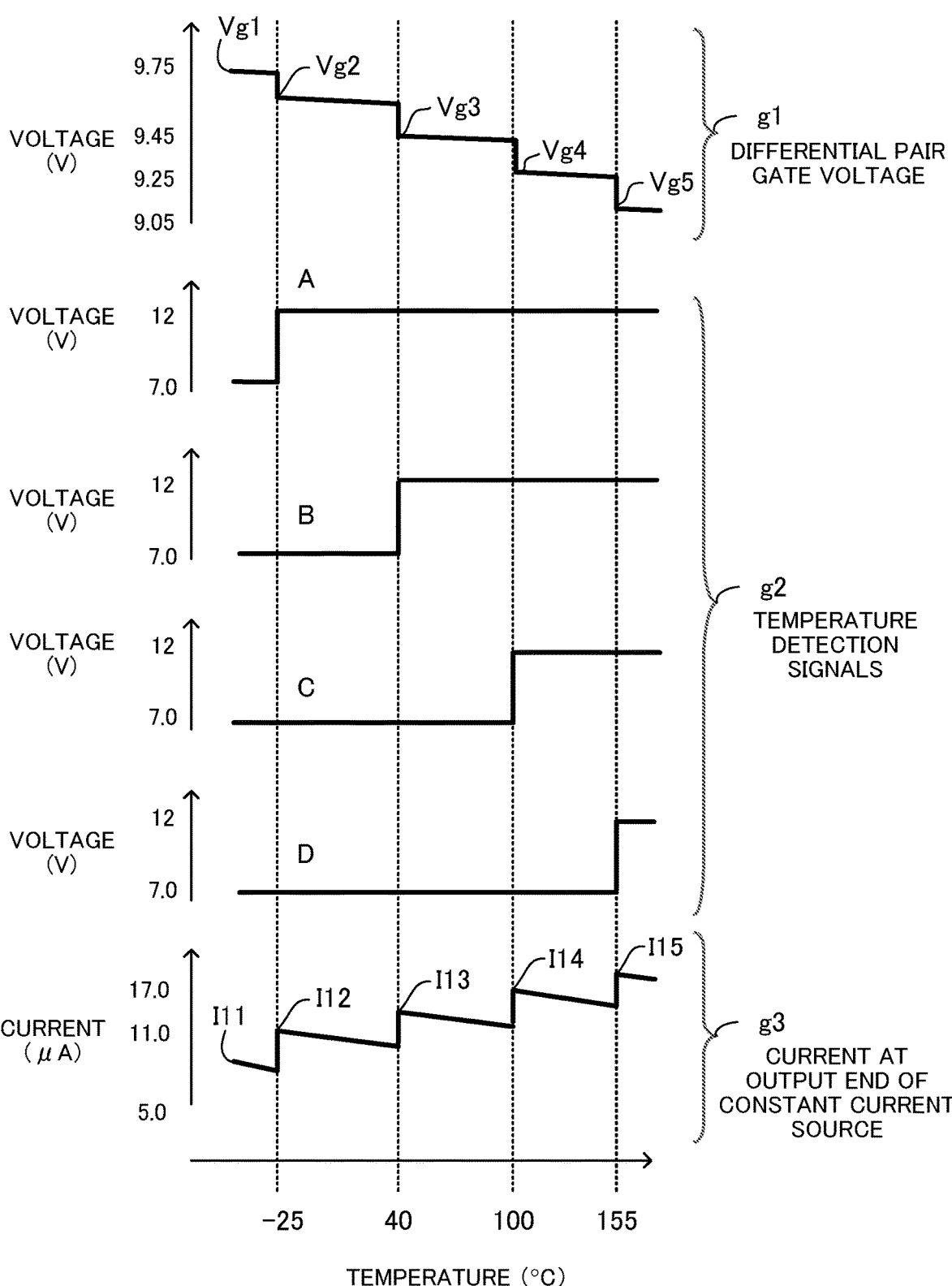
FIG. 14 illustrates an example of waveforms when temperature compensation is performed.

FIG. 14 illustrates an example of waveforms when temperature compensation is performed. A graph g1 indicates a gate voltage (hereinafter, a differential pair gate voltage) of the PMOS transistor M2 or M3, and the vertical axis represents the voltage (V). A graph g2 indicates the temperature detection signals A to D, and the vertical axis represents the voltage (V). A graph g3 indicates the current flowing through the output end of the constant current source IR1, and the vertical axis represents the current (μA). The horizontal axis of each of the graphs g1 to g3 represents the temperature (° C.).

[T<−25° C.] When the temperature T is less than −25° C., the constant current source IR1 outputs a current I11, which gradually decreases with a rise in temperature. The differential pair gate voltage represents a voltage Vg1, which gradually drops with a rise in temperature. In addition, all the temperature detection signals A to D are at an L level.

[−25° C.≤T<40° C.] When the temperature T is −25° C. or more and less than 40° C., because the temperature detection signal A represents an H level and the temperature detection signal B to D each represent an L level, the correction current ic1 is outputted from the correction current element Ic1. As a result, the correction current ic1 is added to the current at the output end of the constant current source IR1. That is, the current is increased to a current I12. This current I12 also gradually decreases with a rise in temperature. The differential pair gate voltage drops from the voltage Vg1 to a voltage Vg2 with the increase of the current, and this voltage Vg2 also drops with a rise in temperature.

[40° C.≤T<100° C.] When the temperature T is 40° C. or more and less than 100° C., because the temperature detection signals A and B each represent an H level, and the temperature detection signals C and D each represent an L level, the correction current ic2 is outputted from the correction current element Ic2. As a result, the correction current ic2 is added to the current at the output end of the constant current source IR1. That is, the current is increased to a current I13. This current I13 also gradually decreases with a rise in temperature. The differential pair gate voltage drops from the voltage Vg2 to a voltage Vg3 with the increase of the current, and this voltage Vg3 gradually drops with a rise in temperature.

[100° C.≤T<155° C.] When the temperature T is 100° C. or more and less than 155° C., because the temperature detection signals A to C each represent an H level, and the temperature detection signal D represents an L level, the correction current ic3 is outputted from the correction current element Ic3. As a result, the correction current ic3 is added to the current at the output end of the constant current source IR1. That is, the current is increased to a current I14. This current I14 also gradually decreases with a rise in temperature. The differential pair gate voltage drops from the voltage Vg3 to a voltage Vg4 with the increase of the current, and this voltage Vg4 gradually drops with a rise in temperature.

[155° C.≤T] When the temperature T is 155° C. or more, because all the temperature detection signals A to D represent an H level, the correction current ic4 is outputted from the correction current element Ic4. As a result, the correction current ic4 is added to the current at the output end of the constant current source IR1. That is, the current is increased to a current I15. This current I15 also gradually decreases with a rise in temperature. The differential pair gate voltage drops from the voltage Vg4 to a voltage Vg5 with the increase of the current. This voltage Vg5 gradually drops with a rise in temperature.

<Temperature Dependency of Overcurrent Detection Threshold>

Figure 15:
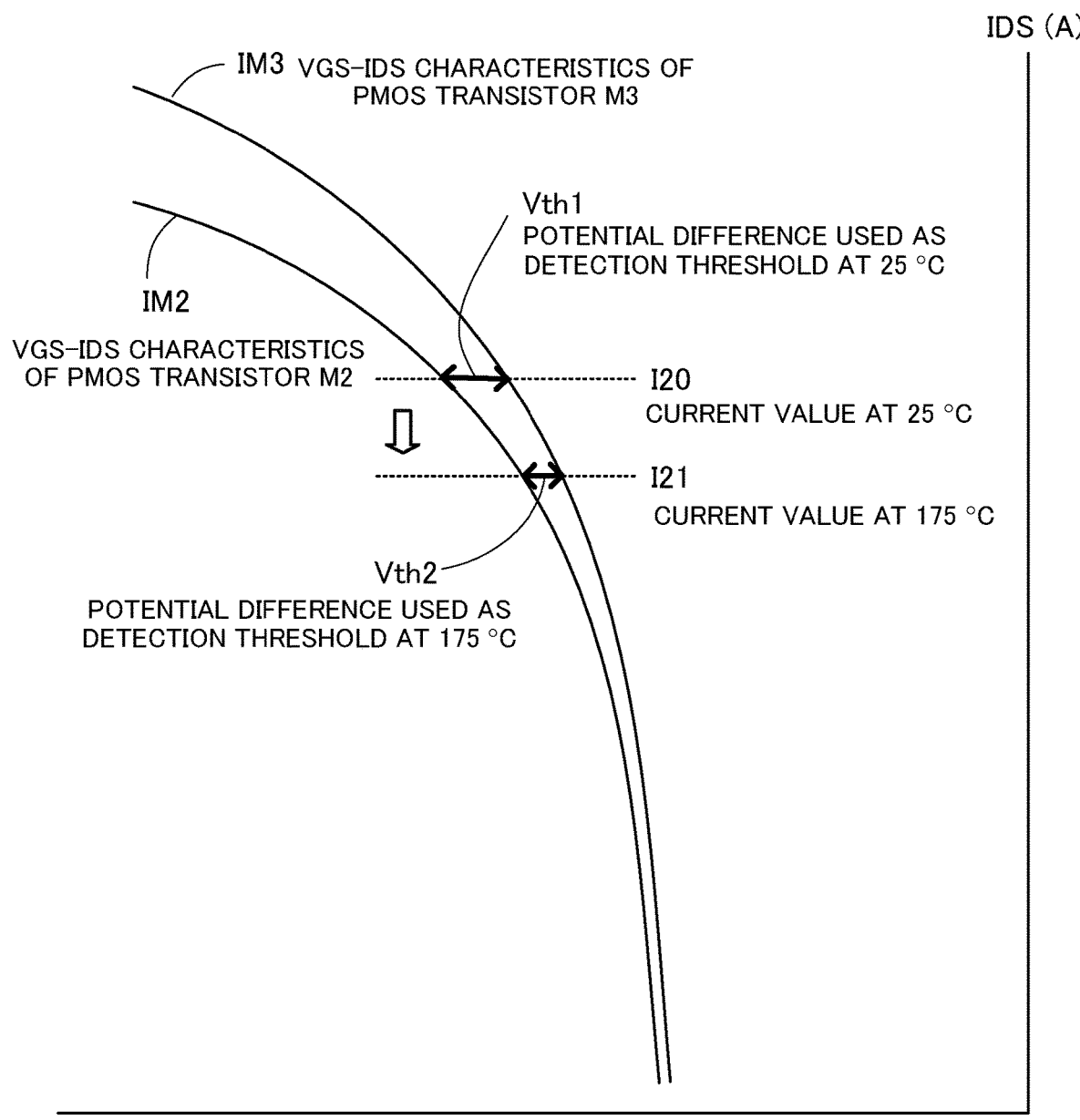
FIG. 15 illustrates temperature dependency of the overcurrent detection threshold.

FIG. 15 illustrates temperature dependency of the overcurrent detection threshold. The vertical axis represents the drain current IDS (A), and the horizontal axis represents the gate-source voltage VGS (V). The drain current of the PMOS transistor M2 will be referred to as a drain current IM2, and the drain current of the PMOS transistor M3 will be referred to as a drain current IM3.

The drain current IM2 indicates VGS-IDS characteristics of the PMOS transistor M2, and the drain current IM3 indicates VGS-IDS characteristics of the PMOS transistor M3. The potential difference between the VGS of the PMOS transistor M2 and the VGS of the PMOS transistor M3 when the drain currents IM2 and IM3 represent the same current value is the detection threshold.

[T=25° C.] When the temperature T is 25°, the current at the output end of the constant current source IR1 is a current I20, and the potential difference used as the detection threshold is Vth1.

[T=175° C.] When the temperature T rises to 175° C., the current at the output end of the constant current source IR1 is decreased from the current I20 to a current I21. The potential difference used as the detection threshold is Vth2 (Vth2<Vth1). That is, the detection threshold decreases with a rise in temperature. In this way, the current value of the constant current source IR1 decreases with a rise in temperature, and the detection threshold at temperature 25° C. decreases as the temperature rises to 175° C.

<Reduction of Variation of Detection Threshold by Temperature Compensation>

Figure 16:
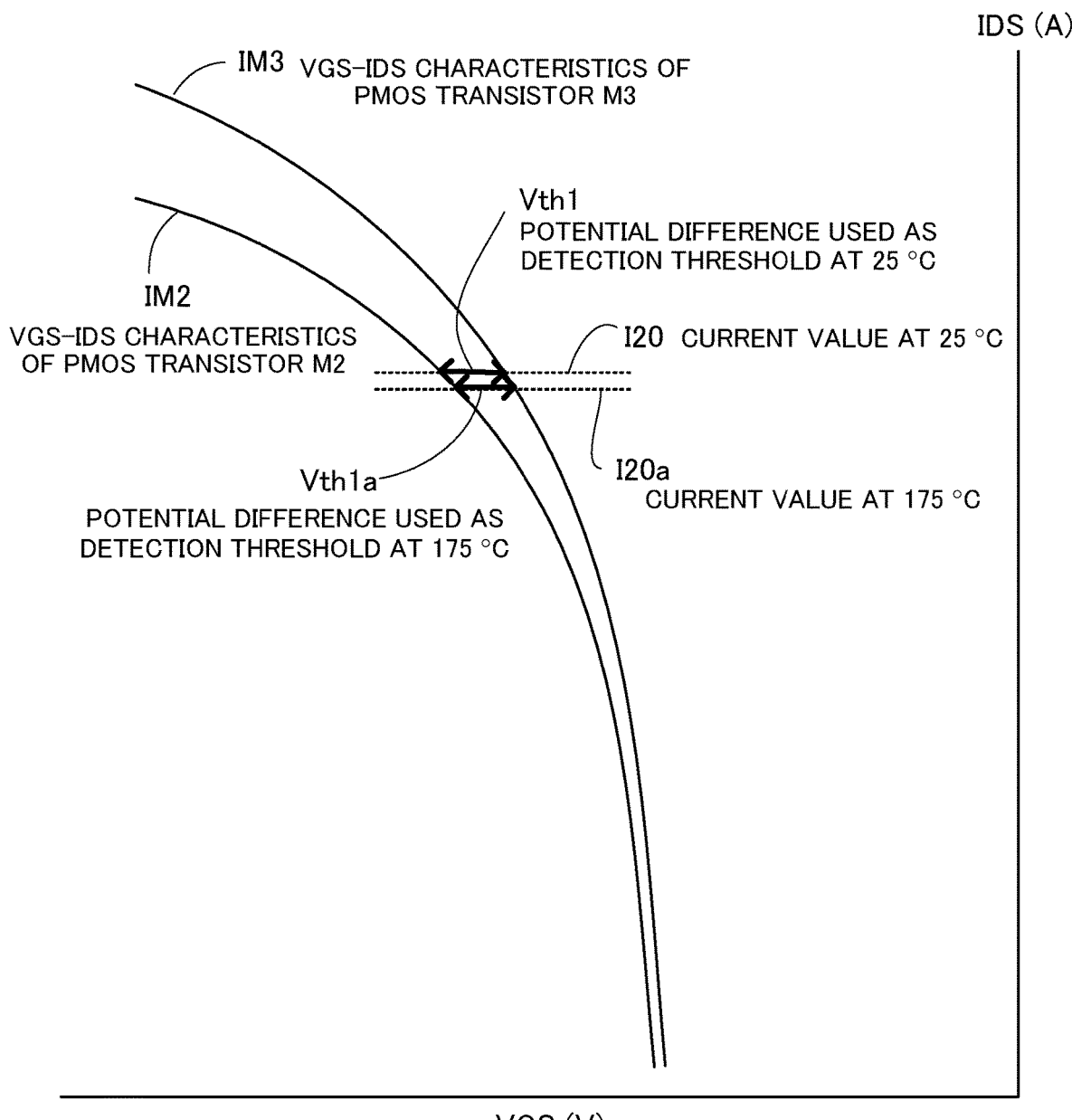
FIG. 16 illustrates reduction in the variation of the detection threshold based on the temperature compensation.

FIG. 16 illustrates reduction of the variation of the detection threshold by temperature compensation. The vertical axis represents the drain current IDS (A), and the horizontal axis represents the gate-source voltage VGS (V).

[T=25° C.] When the temperature T is 25° C., the current at the output end of the constant current source IR1 is the current I20, and the potential difference used as the detection threshold is Vth1.

[T=175° C.] When the temperature T rises to 175° C., the current at the output end of the constant current source IR1 is corrected by the correction current source 12a. As a result, the current I20 is increased to a current I20a. At this point, the potential difference used as the detection threshold is Vth1a (Vth1a≈Vth1). The decrease of the detection threshold due to a rise in temperature is reduced.

As described above, in the case of the overcurrent-protection-circuit-equipped IPS 1-2, the correction current from the correction current source 12a outputted based on the individual temperature detection signal of the temperature detection circuit 11 increases the current at the output end of the constant current source IR1 with a rise in temperature. As a result, even when the temperature rises from 25° C. to 175° C., the decrease of the detection threshold at 25° C. is reduced.

<Inverter Device>

Figure 17:
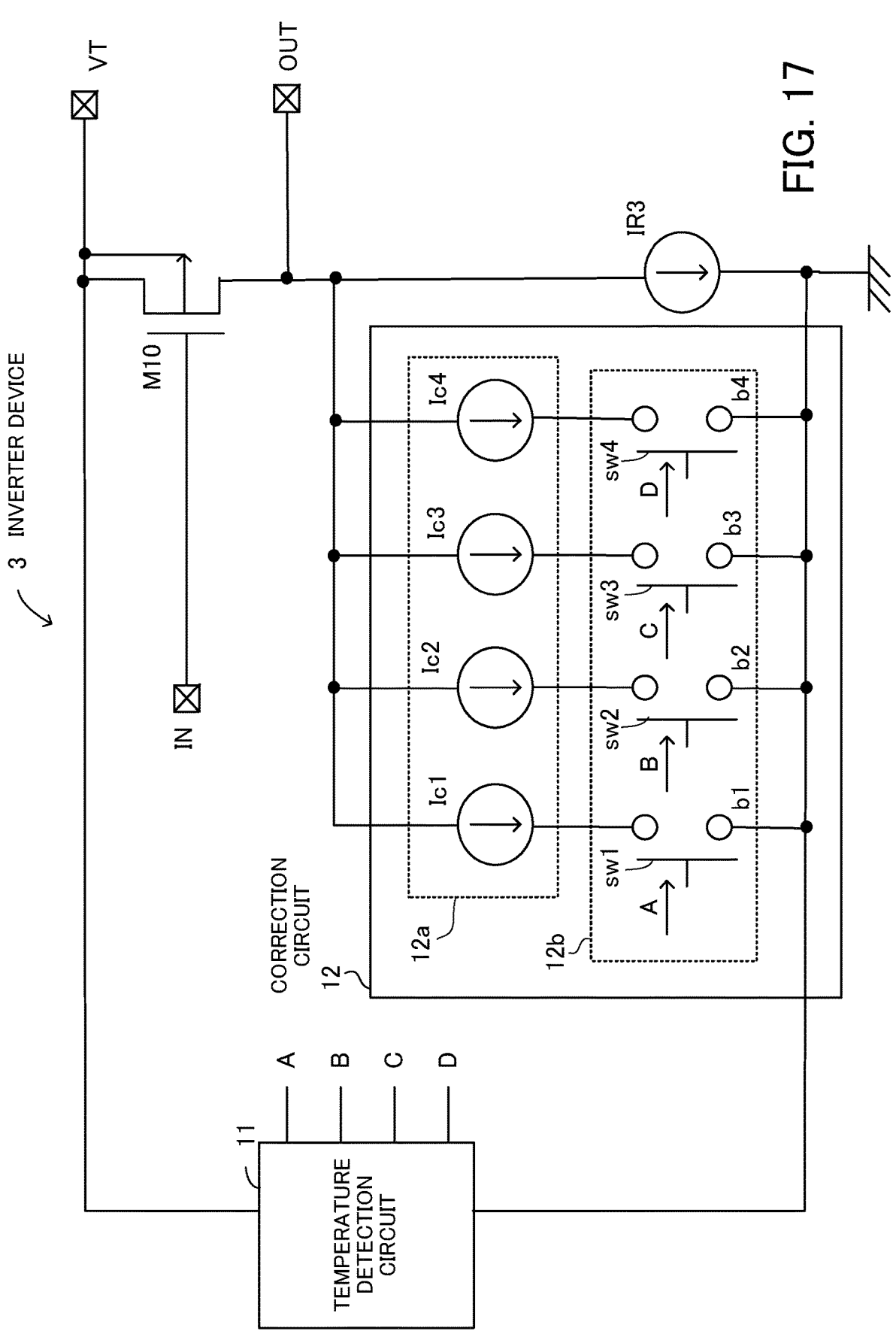
FIG. 17 illustrates a configuration example of an inverter device.

Next, an inverter device will be described as an application example of the temperature compensation function of the semiconductor device 1. FIG. 17 illustrates a configuration example of an inverter device. This inverter device 3 includes a PMOS transistor M10, a constant current source IR3, a temperature detection circuit 11, and a correction circuit 12.

The inverter device 3 is configured by connecting the temperature detection circuit 11 and the correction circuit 12 to an inverter circuit formed by the PMOS transistor M10 and the constant current source IR3. The constant current source IR3 corresponds to the main current source Im illustrated in FIG. 3.

The above elements are connected as follows. An input terminal IN is connected to the gate of the PMOS transistor M10. A power supply terminal VT is connected to the source and the back gate of the PMOS transistor M10 and the power supply terminal of the temperature detection circuit 11.

The input end of the constant current source IR3 is connected to the input ends of correction current elements Ic1 to Ic4, the drain of the PMOS transistor M10, and an output terminal OUT. The output end of the constant current source IR3 is connected to a terminal b1 of a switch sw1, a terminal b2 of a switch sw2, a terminal b3 of a switch sw3, a terminal b4 of a switch sw4, the ground terminal of the temperature detection circuit 11, and a ground GND. For example, the switches sw1 to sw4 may be configured by nMOS elements.

In the above configuration, the current at the output end of the constant current source IR3 is corrected, and the threshold voltage of the inverter circuit formed by the PMOS transistor M10 and the constant current source IR3 is adjusted to a desired value.

Figure 18:
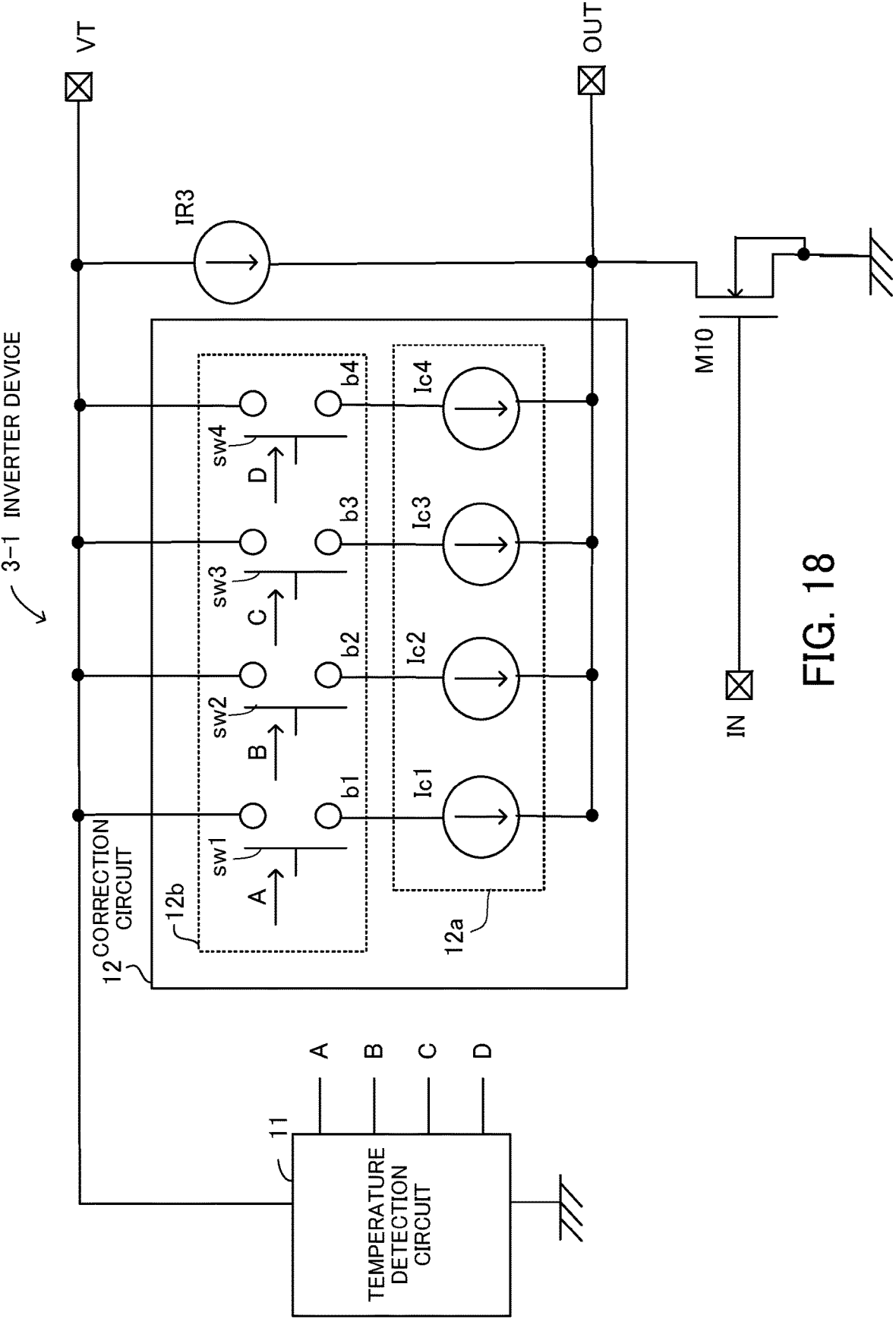
FIG. 18 illustrates a variation of the inverter device.

FIG. 18 illustrates a variation of the inverter device. This inverter device 3-1 has a circuit configuration of another version of the inverter device 3 illustrated in FIG. 17. In the inverter device 3 illustrated in FIG. 17, the constant current source is disposed near the GND. However, in the inverter device 3-1 illustrated in FIG. 18, the constant current source is disposed near the power supply. For example, the switches sw1 to sw4 may be configured by pMOS elements.

<Variation of Overcurrent Protection Circuit>

Figure 19:
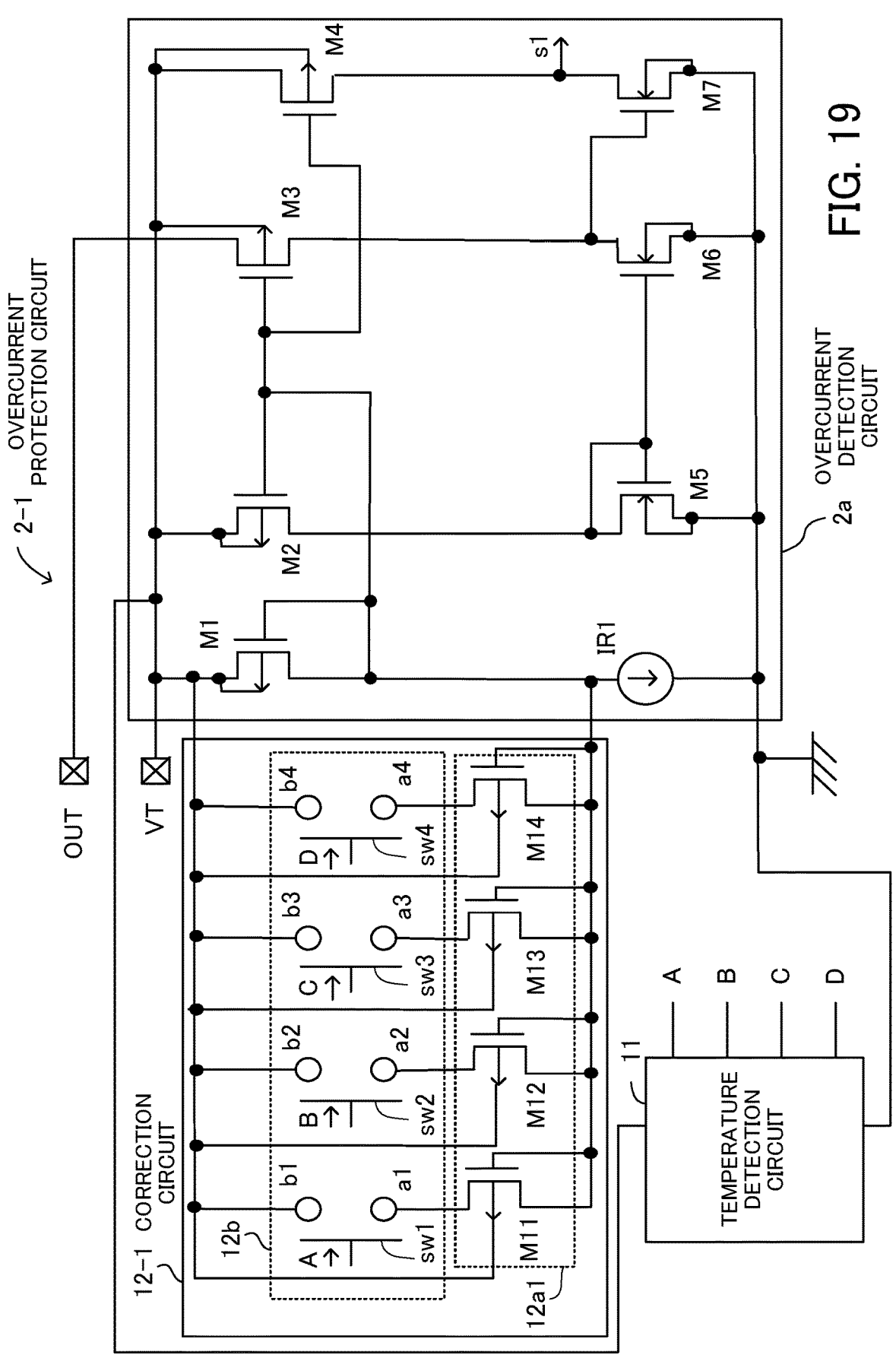
FIG. 19 illustrates a variation of the overcurrent protection circuit.

FIG. 19 illustrates a variation of the overcurrent protection circuit. This overcurrent protection circuit 2-1 is configured by adding the temperature detection circuit 11 and a correction circuit 12-1 to the overcurrent detection circuit 2a illustrated in FIG. 5. The correction circuit 12-1 includes a current mirror ratio correction circuit 12a1 and a switch circuit 12b. The current mirror ratio correction circuit 12a1 includes PMOS transistors M11 to M14 as correction elements.

The PMOS transistors M11 to M14 correspond to first to fourth correction PMOS transistors, respectively. In addition, the correction target of the overcurrent protection circuit 2-1 is the PMOS transistor M1.

The above elements in the correction circuit 12-1 and the PMOS transistor M1 are connected as follows. The source of the PMOS transistor M1 is connected to the power supply terminal VT, the back gate of the PMOS transistor M1, the source and the back gate of the PMOS transistor M2, the back gate of the PMOS transistor M3, and the source and the back gate of the PMOS transistor M4.

In addition, the source of the PMOS transistor M1 is connected to a terminal b1 of a switch sw1, a terminal b2 of a switch sw2, a terminal b3 of a switch sw3, and a terminal b4 of a switch sw4. In addition, the source of the PMOS transistor M1 is connected to the back gate of the PMOS transistor M11, the back gate of the PMOS transistor M12, the back gate of the PMOS transistor M13, and the back gate of the PMOS transistor M14.

The source of the PMOS transistor M11 is connected to a terminal a1 of the switch sw1, and the source of the PMOS transistor M12 is connected to a terminal a2 of the switch sw2. The source of the PMOS transistor M13 is connected to a terminal a3 of the switch sw3, and the source of the PMOS transistor M14 is connected to a terminal a4 of the switch sw4.

The drain of the PMOS transistor M1 is connected to the gate of the PMOS transistor M1, the input end of the constant current source IR1, the gate of the PMOS transistor M2, the gate of the PMOS transistor M3, and the gate of the PMOS transistor M4.

In addition, the drain of the PMOS transistor M1 is connected to the drains of the PMOS transistors M11 to M14.

In addition, the drain of the PMOS transistor M1 is connected to the gates of the PMOS transistors M11 to M14.

In the above configuration, the mirror ratio of the PMOS transistor M1 is adjusted by the temperature detection circuit 11 and the correction circuit 12-1. In this configuration, the PMOS transistor M1 constitutes a current mirror with respect to the PMOS transistors M2 and M3. Thus, by causing the correction circuit 12-1 to adjust the individual current that flows through the PMOS transistors M1 and M11 to M14, the current that flows through the PMOS transistors M2 and M3 is also adjusted.

Thus, for example, even when the number of switches that are switched on with a rise in temperature is decreased, because the current flowing through the PMOS transistors M2 and M3 is increased, the decrease of the detection threshold is reduced. When the individual temperature detection signal is at an H level, the switches sw1 to sw4 are switched on, the PMOS transistors M11 to M14 are turned off, and the gate voltage VGS needed to flow the constant current source IR1 through the PMOS transistor M1 is increased. In this way, the current flowing through the PMOS transistors M2 and M3 is increased.

Figure 20:
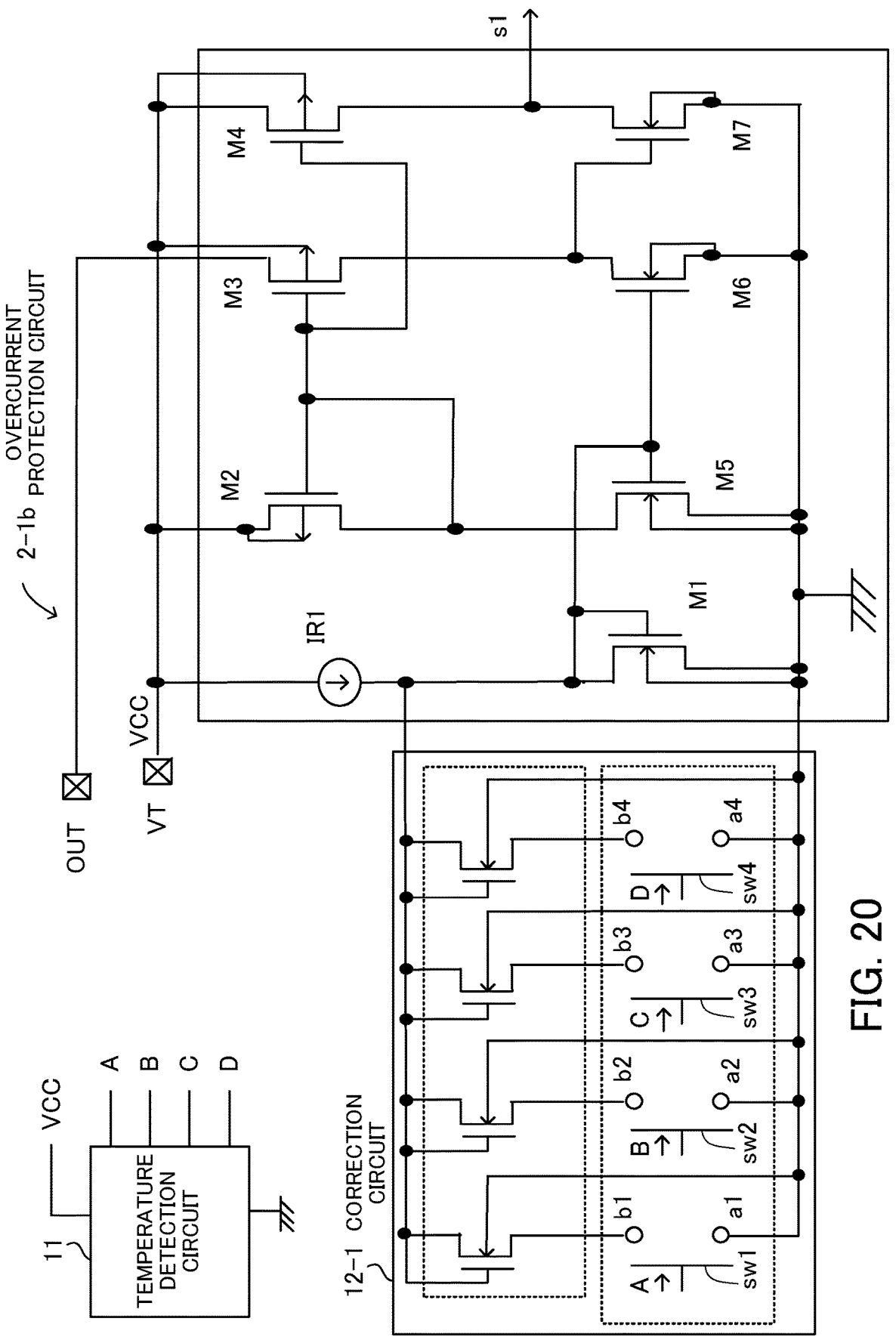
FIG. 20 illustrates a variation of the overcurrent protection circuit.
Figure 21:
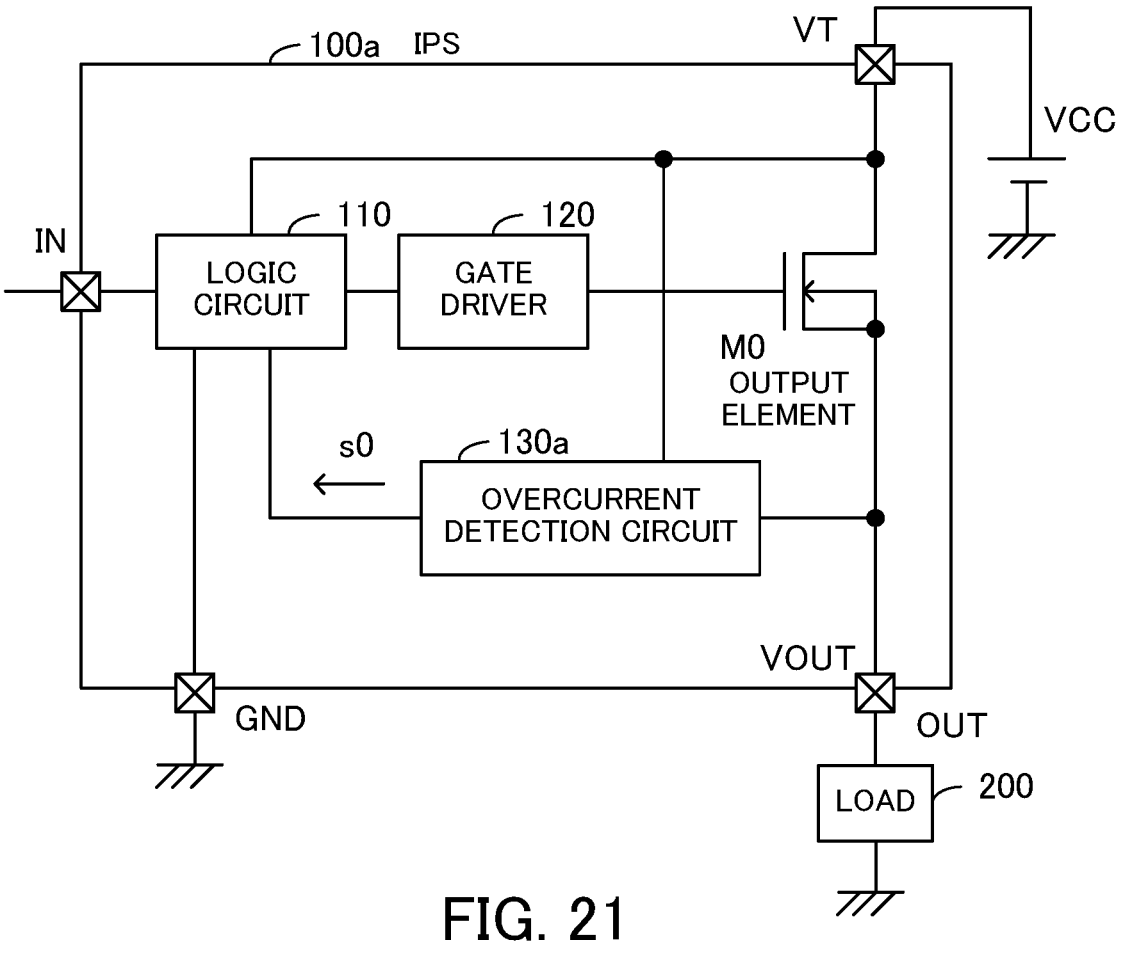
FIG. 21 illustrates a configuration example of a conventional IPS.
Figure 22:
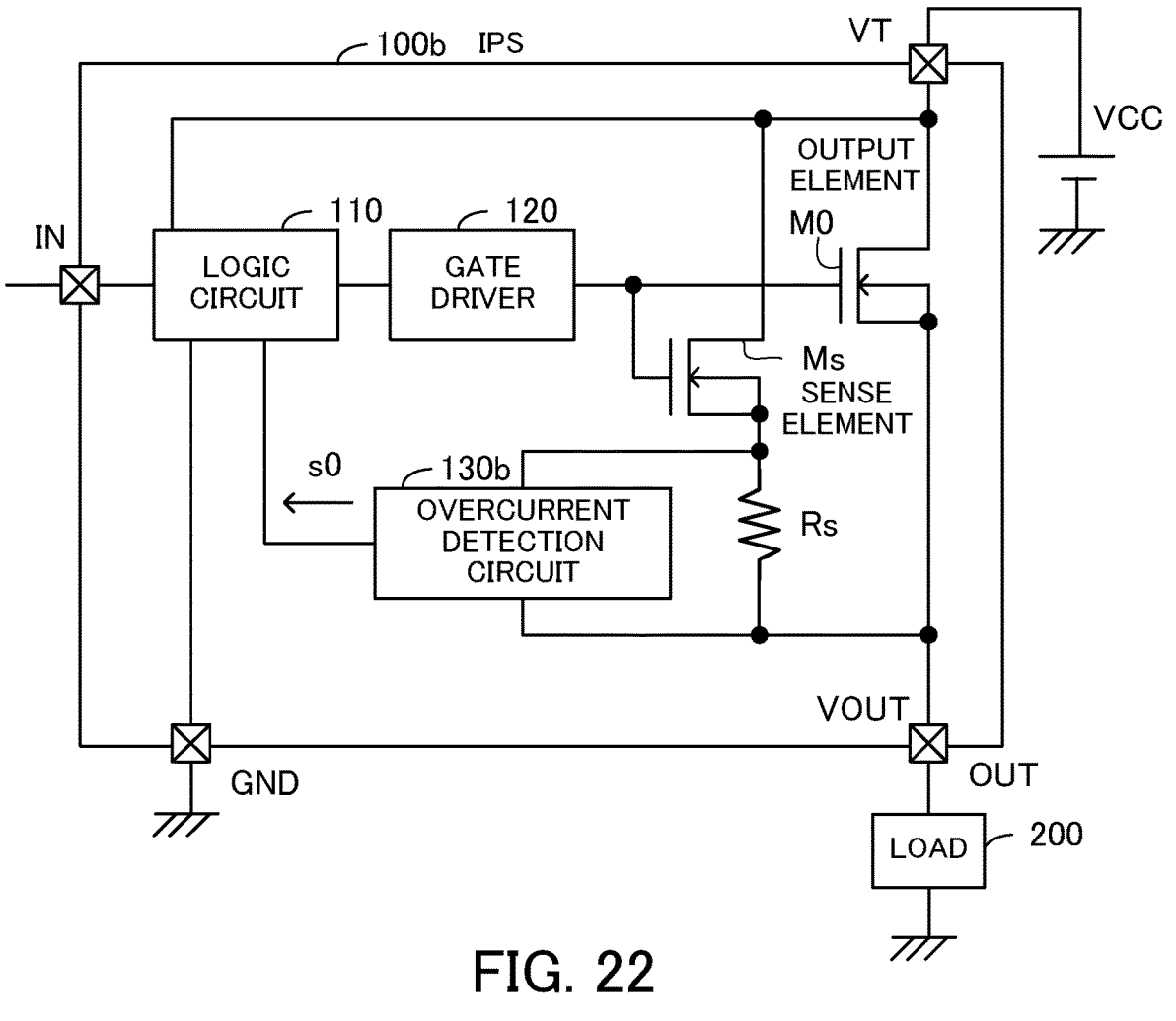
FIG. 22 illustrates a configuration example of another conventional IPS.

FIG. 20 illustrates a variation of the overcurrent protection circuit. This overcurrent protection circuit 2-1b has a circuit configuration of another version of the overcurrent protection circuit 2-1 illustrated in FIG. 19. In the overcurrent protection circuit 2-1 illustrated in FIG. 19, the constant current source is disposed near the GND. However, in the overcurrent protection circuit 2-1b illustrated in FIG. 20, the constant current source is disposed near the power supply. In addition, in the overcurrent protection circuit 2-1 illustrated in FIG. 19, use of nMOS transistors for the switches sw1 to sw4 is assumed. However, in the overcurrent protection circuit 2-1b illustrated in FIG. 20, use of pMOS transistors for the switches sw1 to sw4 is assumed. In either case, by reducing the number of switches sw1 to sw4 that are switched on based on the individual signal from the temperature detection circuit 11, the current of the differential pair is increased.

As described above, according to the embodiment, the temperature of the semiconductor element having temperature dependency is detected, a temperature detection signal based on the detected temperature is generated, and characteristics of the semiconductor element are corrected based on the temperature detection signal.

Since the characteristics of the semiconductor element are corrected by detecting the temperature, even when the temperature changes, the operation accuracy of a device including the semiconductor element having temperature dependency is improved.

In addition, as described above, according to the embodiment, temperature compensation control is performed based on digital temperature detection signals obtained by dividing the temperature into n ranges. That is, by varying the number of elements in the temperature detection circuit 11 and the correction circuit 12 based on the number n of temperature ranges, the degree of freedom in design is easily improved based on the ambient temperature.

While an embodiment has thus been described as an example, any one of the individual elements in the embodiment may be replaced by a different element having an equivalent function. In addition, other elements or steps may be added. In addition, any two or more elements (features) in the above-described embodiment may be combined with each other.

In one aspect, it is possible to improve the operation accuracy of a device including the semiconductor element having temperature dependency.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A semiconductor device, comprising:
a semiconductor element configured to generate an output current that varies with a change in a temperature of the semiconductor element;
a temperature detection circuit that detects the temperature and outputs a temperature detection signal based on the detected temperature; and
a correction circuit that causes the output current of the semiconductor element to change based on the temperature detection signal.

2. A semiconductor device, comprising:
a semiconductor element configured to generate an output current that varies with a change in a temperature of the semiconductor element;
a temperature detection circuit configured to detect the temperature and to output n temperature detection signals respectively corresponding to n temperature ranges, n being a natural number; and
a correction circuit configured to output, based on the n temperature detection signals, a correction current that causes the output current of the semiconductor element to change.

3. The semiconductor device according to claim 2, wherein the temperature detection circuit includes:
a temperature detection constant current source configured to generate a current,
a detection circuit that includes a temperature sensing diode, which provides a temperature detection voltage that is based on the current from the temperature detection constant current source, and that drops with a rise in the temperature of the semiconductor element,
a reference voltage generation unit that generates n reference voltages based on the current from the temperature detection constant current source, and
a comparison circuit that compares the n reference voltages with the temperature detection voltage, and outputs at least one of the temperature detection signals having a predetermined level, upon detecting that at least one of the n reference voltages is higher than the temperature detection voltage.

4. The semiconductor device according to claim 3, wherein the n reference voltages have voltage values in a descending order from a first reference voltage to an nth reference voltage thereof, and
wherein the n temperature detection signals include a first temperature detection signal to an nth temperature detection signal, in which the first temperature detection signal to a kth temperature detection signal have the predetermined level when the kth reference voltage is higher than the temperature detection voltage, k being any natural number between 1 and n.

5. The semiconductor device according to claim 4, wherein the correction circuit includes
a correction element circuit that outputs the correction current, and
a switch circuit that performs switching between an input and an output of the correction circuit based on the n temperature detection signals.

6. The semiconductor device according to claim 5, wherein the correction element circuit includes n correction elements that are a first correction element to a nth correction element,
wherein the switch circuit includes n switches that are a first switch to a nth switch, connected in series with the first correction element to the nth correction element, respectively,
wherein when the first to the kth temperature detection signals have the predetermined level, the first to kth switches are switched on, so as to output currents from the first to the kth correction elements.

7. The semiconductor device according to claim 6, wherein the temperature detection constant current source includes a first constant current source and a second constant current source,
wherein the reference voltage generation unit includes a total of n resistors, which are a first resistor to an nth resistor, connected in series sequentially from a high potential side to a low potential side of the reference voltage generation unit, each resistor having a first end and a second end,
wherein the comparison circuit includes a total of n comparators, which are a first comparator to an nth comparator,
wherein each of the n comparators has a non-inverting input terminal, an inverting input terminal, and an output terminal, the non-inverting input terminals of the n comparators being respectively directly connected to the first ends of the n resistors, such that the n temperature detection signals are respectively output from the output terminals,
wherein an input end of the first constant current source is connected to an input end of the second constant current source and a power supply unit,
wherein an output end of the first constant current source is connected to an anode of the temperature sensing diode and the inverting input terminal of each of the n comparators,
wherein an output end of the second constant current source is connected to the non-inverting input terminal of the first comparator and the first end of the first resistor, and
wherein the second end of the nth resistor is connected to a cathode of the temperature sensing diode and a ground.

8. The semiconductor device according to claim 7, wherein each of the n correction elements is connected in parallel to the semiconductor element, and
wherein each of the n switches is connected in parallel to the semiconductor element.

9. The semiconductor device according to claim 8, wherein the semiconductor element is a component of an overcurrent detection circuit that detects an overcurrent in a current path if the overcurrent detection circuit determines that a potential difference between two points, which are respectively a first terminal of the overcurrent detection circuit and a second terminal of the overcurrent detection circuit, of the current path exceeds a detection threshold.

10. The semiconductor device according to claim 9, wherein the overcurrent detection circuit includes a detection unit, a potential generation unit, and an output unit,
wherein the detection unit includes
a differential element pair including two elements, each element having a first high potential end connected to the first terminal of the overcurrent detection circuit, and a second high potential end connected to the second terminal of the overcurrent detection circuit, and a current mirror circuit connected to a low potential side of the differential element pair, wherein the potential generation unit outputs a generated potential to the differential element pair of the detection unit, wherein the output unit is connected to a low potential side of one of the elements of the differential element pair, the second high potential end of the one element outputting an overcurrent detection signal that indicates an overcurrent detection result, and wherein the semiconductor element is a component of the potential generation unit.

11. The semiconductor device according to claim 10, wherein the potential generation unit includes a constant current source that is the semiconductor element, and a first p-channel metal-oxide-semiconductor (PMOS) transistor having a source, a drain, a gate, and a back gate, wherein the source of the first PMOS transistor is connected to the back gate of the first PMOS transistor and a power supply terminal, wherein the drain of the first PMOS transistor is connected to an input end of the constant current source, the gate of the first PMOS transistor, and an output end of the potential generation unit, wherein an output end of the constant current source is connected to the ground, wherein the two elements of the differential element pair of the detection unit are a second PMOS transistor and a third PMOS transistor, each having a source, a drain, a gate, and a back gate, wherein the gate of the second PMOS transistor and the gate of the third PMOS transistor are connected to the output end of the potential generation unit, wherein the source of the second PMOS transistor is connected to the first terminal of the overcurrent detection circuit at the first high potential end, wherein the source of the third PMOS transistor is connected to the second terminal of the overcurrent detection circuit at the second high potential end, wherein the back gate of the second PMOS transistor and the back gate of the third PMOS transistor are connected to the power supply terminal, wherein the current mirror circuit of the detection unit includes a first n-channel metal-oxide-semiconductor (NMOS) transistor and a second NMOS transistor, each having a source, a drain, a gate, and a back gate, wherein the drain of the first NMOS transistor is connected to the gate of the first NMOS transistor, the gate of the second NMOS transistor, and the drain of the second PMOS transistor, wherein the drain of the second NMOS transistor is connected to the drain of the third PMOS transistor, and wherein the source and the back gate of the first NMOS transistor and the source and the back gate of the second NMOS transistor are connected to the ground.

12. The semiconductor device according to claim 11, wherein each of the n switches has a first terminal, a second terminal, and a control terminal, wherein the correction element circuit is a correction current source, and each of the n correction elements is a correction current element that has an input end and an output end, wherein the input end of each of the correction current elements is connected to the input end of the constant current source, wherein the output ends of the n correction current elements are respectively connected to the first terminals of the n switches, wherein the second terminal of each of the n switches is connected to the output end of the constant current source and the ground, and wherein the control terminals of the n switches are respectively connected to the output terminals of the n comparators.

13. The semiconductor device according to claim 11, wherein the correction element circuit is a current mirror ratio correction circuit, and each of the correction elements is a correction PMOS transistor that has a source, a drain, a gate, and a back gate, wherein the drain and the gate of each of the correction PMOS transistors are connected to the drain of the first PMOS transistor, wherein the sources of the correction PMOS transistors are respectively connected to the first terminals of the switches, wherein the back gates of the correction PMOS transistors are connected to a power supply, and wherein the control terminals of the switches are respectively connected to the output terminals of the comparators.

14. The semiconductor device according to claim 10, wherein the potential generation unit includes a constant current source, and a first n-channel metal-oxide-semiconductor (NMOS) transistor having a source, a drain, a gate, and a back gate, wherein the source of the first NMOS transistor is connected to the back gate of the first NMOS transistor and the ground, wherein the drain of the first NMOS transistor is connected to an output end of the constant current source, the gate of the first NMOS transistor, and an output end of the potential generation unit, wherein the two elements of the differential element pair of the detection unit are a first p-channel metal-oxide-semiconductor (PMOS) transistor and a second PMOS transistor, each having a source, a drain, a gate and a back gate, wherein the gate of the first PMOS transistor is connected to the drain of the first PMOS transistor and the gate of the second PMOS transistor, wherein the source of the first PMOS transistor is connected to the first terminal of the overcurrent detection circuit at the first high potential end, wherein the source of the second PMOS transistor is connected to the second terminal of the overcurrent detection circuit at the second high potential end, wherein the back gate of the first PMOS transistor and the back gate of the second PMOS transistor are connected to a power supply, wherein the current mirror circuit of the detection unit includes a second NMOS transistor and a third NMOS transistor, each having a source, a drain, a gate and a back gate, wherein the gate of the second NMOS transistor the gate of the third NMOS transistor, and the drain of the first PMOS transistor are connected to the potential generation unit, wherein the drain of the second NMOS transistor is connected to the drain of the first PMOS transistor, wherein the drain of the third NMOS transistor is connected to the drain of the second PMOS transistor, and wherein the source and the back gate of the second NMOS transistor and the source and the back gate of the third NMOS transistor are connected to the ground.

15. The semiconductor device according to claim 14, wherein the constant current source is the semiconductor element, wherein each of the n switches has a first terminal, a second terminal, and a control terminal, wherein the correction element circuit is a correction current source, and each of the correction elements is a correction current element that has an input end and an output end, wherein the output end of each of the correction current elements is connected to the output end of the constant current source, wherein the input ends of the n correction current element are respectively connected to the first terminals of the n switches, wherein the second terminal of each of the n switches is connected to the input end of the constant current source, and wherein the control terminals of the n switches are respectively connected to the output terminals of the n comparators.

16. The semiconductor device according to claim 14, wherein the correction element circuit is a current mirror ratio correction circuit, and each of the correction elements is a correction NMOS transistor that has a source, a drain, a gate, and a back gate, wherein the drain and the gate of each of the n transistors are connected to the drain of the first NMOS transistor, wherein the sources of the correction NMOS transistors are respectively connected to the first terminals of the switches, wherein the back gates of the correction NMOS transistor are respectively connected to the second terminals of the switches and the source of the first NMOS transistor, wherein the control terminals of the switches are respectively connected to the output terminals of the comparators, and wherein the first NMOS transistor is the semiconductor element.

17. An intelligent power switch (IPS) having a temperature dependency correction function, the IPS comprising:

the semiconductor device according to claim 12; and an output element that is connected to a power supply voltage via the first terminal of the overcurrent detection circuit and to a load via the second terminal of the overcurrent detection circuit, and drives the load by performing switching based on a drive signal, wherein the overcurrent detection circuit detects the overcurrent by using a potential difference between the power supply voltage and an output voltage, the output voltage being determined by an on-resistance of the output element and a current flowing through the output element, and being applied to the load from the second terminal of the overcurrent detection circuit as an overcurrent detection threshold; and the temperature detection circuit and the correction circuit constitute a temperature compensation circuit.

18. An inverter device having a function of the semiconductor device according to claim 8, the inverter device comprising:

an output element that performs switching based on a drive signal;

a constant current source, which is the semiconductor element, connected in series to the output element;

the temperature detection circuit; and the correction circuit.

19. The inverter device according to claim 18, wherein each of the n switches has a first terminal, a second terminal, and a control terminal, wherein the correction element circuit is a correction current source, and each of the correction elements is a correction current element that has an input end and an output end, wherein the input end of each of the correction current elements is connected to an input end of the constant current source, wherein the output ends of the n correction current elements are respectively connected to the first terminals of the n switches, wherein the second terminal of each of the n switches is connected to an output end of the constant current source and the ground, and wherein the control terminals of the n switches are respectively connected to the output terminals of the n comparators.

20. The inverter device according to claim 18, wherein each of the n switches has a first terminal, a second terminal, and a control terminal, wherein the correction element circuit is a correction current source, and each of the correction elements is a correction current element that has an input end and an output end, wherein the output end of each of the correction current elements is connected to an output end of the constant current source, wherein the input ends of the correction current elements are respectively connected to the first terminals of the n switches, wherein the second terminal of each of the n switches is connected to an input end of the constant current source, and wherein the control terminals of the n switches are respectively connected to the output terminals of the n comparators.

* * * * *